US012620960B2

(12) United States Patent
Tabrizian et al.

(10) Patent No.: US 12,620,960 B2
(45) Date of Patent: May 5, 2026

(54) COMPLEMENTARY SWITCHABLE DUAL-MODE BULK ACOUSTIC WAVE RESONATOR AND FILTER

(71) Applicant: University of Florida Research Foundation, Incorporated, Gainesville, FL (US)

(72) Inventors: Roozbeh Tabrizian, Gainesville, FL (US); Dicheng Mo, Gainesville, FL (US); Shaurya Dabas, Gainesville, FL (US); Sushant Rassay, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 343 days.

(21) Appl. No.: 18/341,114

(22) Filed: Jun. 26, 2023

(65) Prior Publication Data

US 2024/0007075 A1     Jan. 4, 2024

Related U.S. Application Data

(60) Provisional application No. 63/367,255, filed on Jun. 29, 2022.

(51) Int. Cl.
*H03H 9/02*     (2006.01)

(52) U.S. Cl.
CPC .... *H03H 9/02062* (2013.01); *H03H 9/02015* (2013.01); *H03H 9/02047* (2013.01)

(58) Field of Classification Search
CPC ........... H03H 9/02062; H03H 9/02015; H03H 9/02047; H03H 2003/023; H03H 2009/02188; H03H 3/02
USPC ................................................. 333/186–188
See application file for complete search history.

(56) References Cited

U.S. PATENT DOCUMENTS

2021/0104993 A1 *  4/2021  Vetury ................... H03H 9/568
2022/0123719 A1 *  4/2022  Burak ................. H03H 9/0207

* cited by examiner

*Primary Examiner* — Jorge L Salazar, Jr.
(74) *Attorney, Agent, or Firm* — Alston & Bird LLP

(57)     ABSTRACT

A laminated $Sc_xAl_{1-x}N$ BAW resonator with complementary-switchable operation in thickness extensional modes ($TE_1$ and $TE_N$). The resonator comprises ferroelectric $Sc_xAl_{1-x}N$ layers alternatively stacked with metal electrodes, enabling independent polarization switching of each piezoelectric layer. Opting for unanimous or alternative poling of the $Sc_xAl_{1-x}N$ layers, the resonator can be switched to operate in two complementary states with either $TE_1$ or $TE_N$ active resonance modes of similarly large $k_t^2$.

19 Claims, 22 Drawing Sheets

COMPLEMENTARY SWITCHABLE DUAL-MODE BULK ACOUSTIC WAVE RESONATOR AND FILTER

CROSS REFERENCE TO RELATED APPLICATION

This application claims the priority of U.S. Provisional Application No. 63/367,255, entitled "COMPLEMENTARY SWITCHABLE DUAL-MODE BULK ACOUSTIC WAVE RESONATOR AND FILTER," filed on Jun. 29, 2022, the disclosure of which is hereby incorporated by reference in its entirety.

GOVERNMENT SUPPORT

This invention was made with government support under Agreement No. HR0011-20-9-0049, awarded by DARPA. The government has certain rights in the invention.

TECHNICAL FIELD

The present application relates to a bulk acoustic wave resonator, and more particularly to a bulk acoustic wave resonator with complementary switchable operation.

BACKGROUND

With the ever-rising increase in wireless data traffic, adaptive spectrum allocation becomes increasingly vital to avoid congestion and interference. Realization of adaptive spectrum allocation in wireless systems requires reconfigurable spectral processors that enable dynamic control over pass- and stop-bands at the radio frequency front-end (RFFE).

Currently, integrated radio frequency (RF) duplexers and filters are created using aluminum nitride (AlN) surface and bulk acoustic wave (S/BAW) resonators. High quality-factor (Q) AlN BAW and SAW filter technologies with frequencies as high as 6 GHz are extensively adopted in RFFE of modern wireless systems. These technologies, however, do not provide any intrinsic frequency tunability or switchability, and their operation is limited to a fixed band. Therefore, extension of communication capacity, to enhance data rates and exploit uncongested spectrum in centimeter (cm)- and millimeter (mm)-wave regimes, may require arraying a large set of fixed-frequency filters using external switches to enable band selection and data aggregation. This strategy is not scalable considering the unfavorable increase in RFFE footprint with the addition of new filters, and excessive loss and power consumption of multiplexers needed for switching.

As an alternative, existing acoustic resonator technologies can achieve intrinsic configurability based on the use of perovskite ferroelectric and paraelectric transducers. In these technologies the dependence of transducer polarization and acoustic velocity on direct current (DC) electric field enables intrinsic switching and frequency tuning of the resonator. However, the major limitation of existing acoustic resonator technologies is their frequency scaling beyond the ultra-high-frequency regime (UHF: 0.3-3 GHz). This is due to the excessive electrical and mechanical loss of conventional perovskite and ferroelectric films and the processing challenges with thickness miniaturization upon extreme frequency scaling of the resonators.

BRIEF SUMMARY

Various embodiments described herein relate to laminated $Sc_xAl_{1-x}N$ BAW resonators with complementary switchable operation in first and second thickness extensional modes. In some embodiments, two ferroelectric scandium-aluminum nitride ($Sc_xAl_{1-x}N$) layers are alternatively stacked with three molybdenum (Mo) electrode layers, to create a laminated $Sc_xAl_{1-x}N$ BAW resonator with independent switchability of polarization in constituent transducers. A laminated $Sc_xAl_{1-x}N$ BAW resonator may include intrinsic switchability between first and second thickness modes, when the $Sc_xAl_{1-x}N$ layers are poled in the same or opposite directions, respectively.

According to one embodiment, a laminated $Sc_xAl_{1-x}N$ BAW resonator comprises alternative stacking of two $Sc_{0.28}Al_{0.72}N$ layers with three Mo electrode layers, enabling tailorability of transducer polarization across the thickness. In some embodiments, the laminated $Sc_xAl_{1-x}N$ BAW resonator may comprise an intrinsically switchable thickness-extensional $Sc_xAl_{1-x}N$ BAW resonator including self-ovenization to reduce switching voltage. Upon aligning the polarization of the two $Sc_{0.28}Al_{0.72}N$ layers in the same or opposite directions, the electromechanical coupling of the thickness-extensional mode may be maximized or nulled, resulting in operation of the resonator in "on" and "off" states, respectively. The switching voltage may be significantly reduced by self-ovenization of the resonator through a DC-biased serpentine-shaped top electrode and due to a temperature-dependent reduction in $Sc_{0.28}Al_{0.72}N$ coercive field.

According to one embodiment, a bulk acoustic wave resonator comprises a silicon substrate, an aluminum nitride layer deposited on the silicon substrate, and a stack comprising ferroelectric scandium-aluminum nitride layers alternatively stacked between molybdenum electrode layers.

In some embodiments, the bulk acoustic wave resonator further comprises independent switchability of polarization. In some embodiments, the bulk acoustic wave resonator further comprises intrinsic switchability between first and second thickness modes based on poling of the ScAlN layers in same or opposite directions. In some embodiments, the bulk acoustic wave resonator further comprises a self-ovenization component configured to reduce switching voltage. In some embodiments, the self-ovenization component comprises a direct current-biased serpentine-shaped top electrode. In some embodiments, the bulk acoustic wave resonator further comprises operation in on and off states based on polarization alignment of the ScAlN layers in same or opposite directions.

In some embodiments, the ScAlN layers are deposited using reactive magnetron sputtering from segmented scandium-aluminum targets. In some embodiments, the Mo electrode layers are deposited using direct current sputtering. In some embodiments, a bottom one of the Mo electrode layers is patterned using boron trichloride ($BCl_3$) gas in an inductively coupled plasma reactive-ion-etching system. In some embodiments, the bottom Mo electrode layer comprises a bottom Mo electrode patterned using tapered photoresist mask features created by proximity exposure mode photolithography. In some embodiments, one or more of the Mo electrode layers include slanted sidewalls. In some embodiments, a top one of the Mo electrode layers comprises a top Mo electrode patterned using a photoresist mask created in contact mode lithography.

In some embodiments, the ScAlN layers are etched using a timed chlorine-hydrogen ($Cl_2$—$H_2$) based recipe. In some embodiments, the ScAlN layers are 150 nm-thick. In some embodiments, the bulk acoustic wave resonator further comprises a first state including a first thickness-extensional mode that operates at approximately 7 GHz and a second state including a second thickness-extensional mode that operates at approximately 13 GHz. In some embodiments, the bulk acoustic wave resonator further comprises complementary switchable operation between a first operation state and a second operation state. In some embodiments, the first operation state comprises unanimous polarization direction in the ScAlN layers. In some embodiments, the second operation state comprises alternative polarization switching of the ScAlN layers.

BRIEF DESCRIPTION OF THE DRAWINGS

Embodiments incorporating teachings of the present disclosure are shown and described with respect to the figures presented herein.

DETAILED DESCRIPTION

Figure 1A:
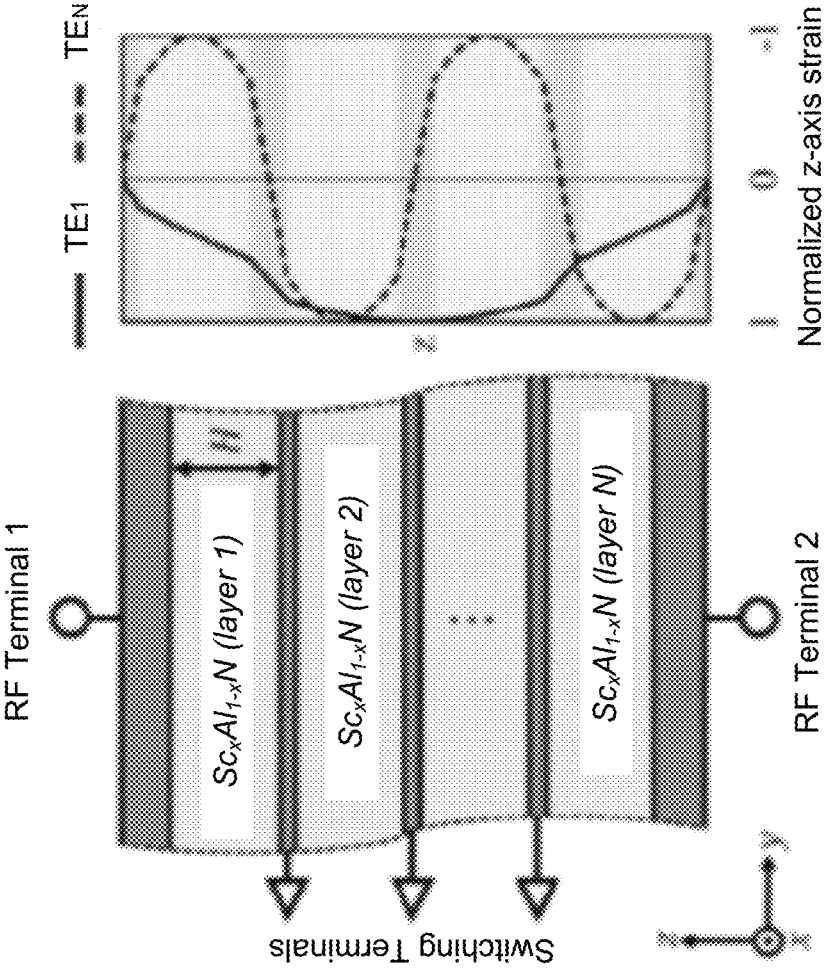
FIG. 1A illustrates a laminated $Sc_xAl_{1-x}N$ BAW resonator structure in accordance with some embodiments discussed herein.

Various embodiments of the present disclosure now will be described more fully hereinafter with reference to the accompanying drawings, in which some, but not all embodiments of the disclosure are shown. Indeed, the disclosure may be embodied in many different forms and should not be construed as limited to the embodiments set forth herein. Rather, these embodiments are provided so that this disclosure will satisfy applicable legal requirements. The term "or" is used herein in both the alternative and conjunctive sense, unless otherwise indicated. The terms "illustrative," "example," and "exemplary" are used to be examples with no indication of quality level. Like numbers refer to like elements throughout.

General Overview and Example Technical Improvements

Scandium-aluminum nitride ($Sc_xAl_{1-x}N$) is growingly considered to replace aluminum nitride films that are currently used for creating radio-frequency acoustic resonators and filters for wireless systems. Significantly larger electromechanical coupling factor ($k_t^2$) that increases with Scandium (Sc) content enables realization of filters with higher bandwidth and lower loss. Further, ferroelectricity in $Sc_xAl_{1-x}N$ provides unprecedented opportunities for realization of intrinsic switchability and tunability without the need for external switches and varactors. This is highly desirable considering the adoption of multi-band radio frequency (RF) front-end to accommodate efficient communication in crowded and congested ecosystems of the modern connected world.

Polarization tuning may be used for intrinsic switching of acoustic resonators created in perovskite ferroelectric or paraelectric films, such as $PbZr_{0.52}Ti_{0.48}O_3$ (PZT) and $Ba_{0.65}Sr_{0.35}TiO_3$ (BST). These materials generally provide a soft ferroelectric behavior, where the polarization, dielectric constant, and piezoelectric coupling can be continuously tuned by application of a direct current (DC) voltage. However, typical $Sc_xAl_{1-x}N$ resonators provide hard ferroelectric behavior, and may include a box-shaped hysteresis loop consisting of binary polarization states with similar electromechanical coupling. Targeting intermediate polarization states through application of DC voltage is also not trivial in $Sc_xAl_{1-x}N$, considering undesirably close breakdown and coercive fields. The large coercive field of $Sc_xAl_{1-x}N$, which may be nearly two orders of magnitude higher compared to conventional perovskites, can result in very large switching and tuning voltages that is hard to provide on chip.

Despite these challenges, intrinsically switchable $Sc_xAl_{1-x}N$ BAW and Lamb wave resonators may be created based on tuning polarization through application of low-frequency pulses. However, existing approaches include application of switching pulses with slightly lower voltage than coercive to enable "transducer depolarization" through reversing c-axis in a fraction of ferroelectric domains and reducing the net electromechanical coupling by charge cancellation. These approaches, however, are not reliable due to the uncertain nature of partial domain switching. Furthermore, in conventional BAW resonators, an electric field is applied uniformly across the piezoelectric film thickness through top and bottom metal electrodes. This architecture limits the electrically excitable acoustic modes to odd thickness-extensional and thickness-shear harmonics. Further, $k_t^2$ of higher-order odd modes decreases proportionally to the mode number due to excessive charge cancellation across transducer thickness. Efficient excitation of acoustic resonance modes in piezoelectric transducers require harmonic alignment of mechanical stress profile and applied electric field.

The present application discloses a super high-frequency (SHF) BAW resonator architecture based on laminating two $Sc_xAl_{1-x}N$ layers with independent electrical control of polarization direction of the $Sc_xAl_{1-x}N$ layers. The disclosed architecture may enable complementary-switchable operation of the resonator in different thickness-extensional modes including harmonics with consistently large $k_t^2$ and Q. According to some embodiments, a laminated $Sc_xAl_{1-x}N$ BAW resonator may be created from alternative stacking of N $Sc_xAl_{1-x}N$ layers with N+1 metal layers (e.g., an integer N≥1), where 0<x<1. Such a structure may enable creation of a resonator with a single RF port and N isolated DC ports for independent polarization control of $Sc_xAl_{1-x}N$ layers.

FIG. 1A depicts a laminated $Sc_xAl_{1-x}N$ BAW resonator structure according to various embodiments of the present disclosure. A RF electric field may be applied uniformly across the N $Sc_xAl_{1-x}N$ layers through top and bottom electrodes, while intermediate electrodes enable independent control of the polarization direction in $Sc_xAl_{1-x}N$ layers based on the ferroelectric behavior. FIG. 1A further depicts the z-axis strain for a first and $N^{th}$ (e.g., N=4 in the depicted example) thickness-extensional modes (e.g., $TE_1$ and $TE_N$).

Reversing polarization direction, by applying low-frequency switching pulses, may enable 180° phase-shift in mechanical excitations. This facilitates excitation of both odd and even thickness modes with similarly large $k_t^2$, despite the uniform electric field across all the $Sc_xAl_{1-x}N$ layers.

Assuming infinitesimally thin metal electrodes, the mode-shape function of the $M^{th}$ thickness-extensional BAW mode ($TE_M$) in the lamination of N $Sc_xAl_{1-x}N$ layers with thickness of H may be formulated by the normalized z-axis strain $\varepsilon_{zz,M}(z)$ as:

$$\varepsilon_{zz,M}(z) = \sin\left(\frac{M\pi}{NH}z\right). \tag{1}$$

Considering the linear dependence of the effective longitudinal piezoelectric coefficient ($\varepsilon_{33,eff}$) in $Sc_xAl_{1-x}N$ on its instantaneous polarization ($P_{inst}$), the electric displacement ($D_{Z,M}$) across the laminated stack can be derived as:

$$D_{z,M}(z) = e_{33}P_{inst}(z)\varepsilon_{zz,M}(z). \tag{2}$$

In the above Equation (2), $e_{33}$ may represent the longitudinal piezoelectric constant for a perfectly metal-polar (M-polar) $Sc_xAl_{1-x}N$ layer. The motional charge per unit area ($Q_{m,M}$) can be derived from:

$$Q_{m,M} = \int_0^{NH} \frac{D_{z,M}(z)}{NH}dz \tag{3}$$
$$= e_{33}\sum_{i=1}^{N}\int_{(i-1)H}^{iH} \frac{P_{inst,i}\varepsilon_{zz,M}(z)}{NH}dz.$$

In the above Equation (3), $P_{inst,i}$ comprises $P_{inst}$ in the $i_{th}$ $Sc_xAl_{1-x}N$ layer. Using Equation (3), the $k_t^2$ of the $TE_M$ mode can be derived as:

$$k_{t,M}^2 = \frac{\frac{1}{2}\frac{Q_{m,M}^2}{C_0}}{\frac{1}{2}\frac{Q_{m,M}^2}{C_0} + \int_0^{NH}\frac{c_{33}}{2}\varepsilon_{zz,m}^2(z)dz}. \tag{4}$$

In the above Equation (4), $c_{33}$ may represent an elastic z-axis elastic constant of $Sc_xAl_{1-x}N$ and $C_0$ may represent the laminate capacitance per unit area:

$$C_0 = \frac{\epsilon_{33}}{NH}. \tag{5}$$

where $\epsilon_{33}$ may comprise a z-axis dielectric constant. Considering Equation (3) and Equation (4), $Q_{m,M}$ and $$k_{t,m}^2$$

can be maximized by proper switching of constituent $Sc_xAl_{1-x}N$ layers in the laminate to maximally harmonize $\varepsilon_{zz,M}$. According to some embodiments, opting for unanimous (i.e., State 1: $P_{inst,i}=\pm1$ for all inst) or alternative (i.e., State 2: $P_{inst,i}+(-1)^i$) poling of $Sc_xAl_{1-x}N$ layers, two optimum operation states may be recognized.

A first operation state having unanimous polarization may comprise unanimous polarization direction in all $Sc_xAl_{1-x}N$ layers resulting in the highest $k_t^2$ for a $TE_1$ mode when inserting $P_{inst,i}=\pm1$ in Equation (3) and Equation (4) and derived as:

$$k_{t,1}^2 = \frac{\frac{e_{33}^2}{\epsilon_{33}}\left(\int_0^{NH}\sin\left(\frac{\pi z}{NH}\right)dz\right)^2}{\frac{e_{33}^2}{\epsilon_{33}}\left(\int_0^{NH}\sin\left(\frac{\pi z}{NH}\right)dz\right)^2 + \int_0^{NH}\frac{c_{33}}{2}\left(\sin\left(\frac{\pi z}{NH}\right)\right)^2 dz} \tag{6}$$
$$= \frac{8}{\pi^2}\cdot\frac{e_{33}^2}{\epsilon_{33}c_{33}}\cdot\frac{1}{1+\frac{e_{33}^2}{\epsilon_{33}c_{33}}}.$$

7

In the first operation state, the motional charge of the $TE_N$ mode ($Q_{m,N}$) may be nulled considering:

$$Q_{m,N} = e_{33} \int_0^{NH} \sin\left(\frac{N\pi z}{NH}\right) dz = 0. \tag{7}$$

This results in a $k_t^2$ of 0 for the $TE_N$ mode.

A second operation state having alternative polarization may comprise alternative polarization switching of the layers in laminate (e.g., State 2: $P_{inst,i}=(-1)^i$) results in perfectly constructive accumulation of motional charge for the $TE_N$ mode considering:

$$\begin{aligned} Q_{m,N} &= e_{33} \sum_{i=1}^{N} \int_{(i-1)H}^{iH} (-1)^i \sin\left(\frac{\pi}{H}z\right) dz \\ &= N \int_0^H \sin\left(\frac{\pi}{H}z\right) dz \end{aligned} \tag{8}$$

This results in a maximum $k_t^2$ for $TE_N$ mode derived as:

$$\begin{aligned} k_{t,N}^2 &= \frac{\frac{e_{33}^2}{\epsilon_{33}}\left(N\int_0^H \sin\left(\frac{\pi}{H}z\right)dz\right)^2}{\frac{e_{33}^2}{\epsilon_{33}}\left(N\int_0^H \sin\left(\frac{\pi}{H}z\right)dz\right)^2 NH + c_{33}\int_0^{NH} \varepsilon_{zz,N}^2(z)dz} \\ &= \frac{8}{\pi^2} \cdot \frac{e_{33}^2}{\epsilon_{33}c_{33}} \cdot \frac{1}{1 + \frac{e_{33}^2}{\epsilon_{33}c_{33}}} \end{aligned} \tag{9}$$

In the second operation state, the motional charge, $Q_{m,1}$, for the $TE_1$ mode is derived as:

$$\begin{aligned} Q_{m,1} &= e_{33} \sum_{i=1}^{N} \int_{(i-1)H}^{iH} (-1)^i \varepsilon_{zz,M}(z)dz \\ &= \frac{e_{33}}{2} \sum_{i=1}^{N} (-1)^i \left( \int_{(i-1)H}^{iH} \varepsilon_{zz,1}(z)dz + \int_{(N-i)H}^{(N-1+1)H} \varepsilon_{zz,1}(z)dz \right) \end{aligned} \tag{10}$$

Replacing $TE_1$ mode z-axis strain $\varepsilon_{zz,1}$ and using auxiliary variable $\hat{Z}=NH-z$, Equation (10) can be simplified using:

$$\begin{aligned} \int_{(N-i)H}^{(N-i+1)H} \sin\left(\frac{\pi}{NH}z\right)dz \,\& &= -\int_{(i-1)H}^{iH} \sin\left(\frac{\pi}{NH}(NH-\hat{z})\right)d\hat{z} \\ &= -\int_{(i-1)H}^{iH} \sin\left(\frac{\pi}{NH}\hat{z}\right)d\hat{z} \end{aligned} \tag{11}$$

Inserting Equation (11) in Equation (10), $Q_{m,1}$ is nulled. This results in a $k_t^2$ of 0 for the $TE_1$ mode, when operating in the second operation state.

Figure 1C:
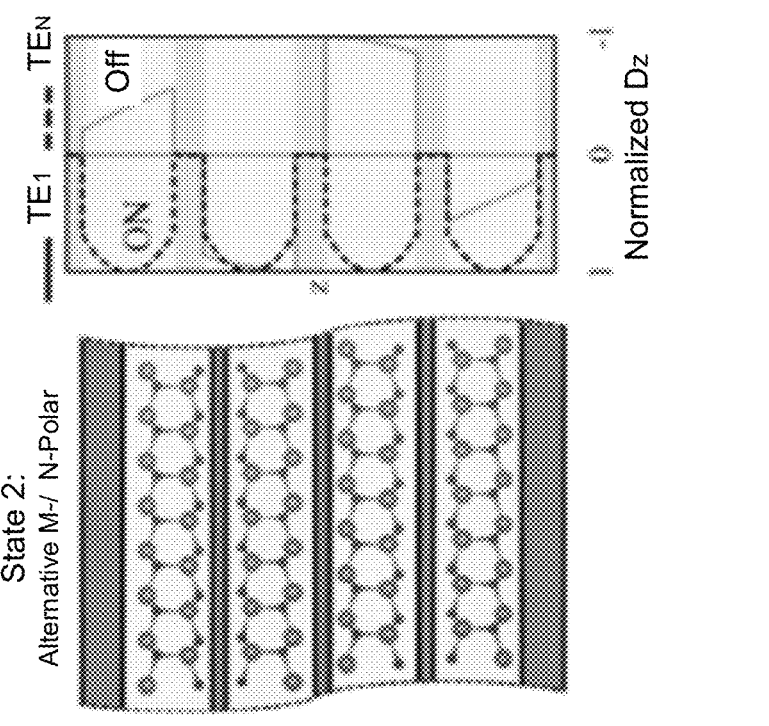
FIGS. 1B and 1C illustrate electrical displacement for modes in two operation states in accordance with some embodiments discussed herein.
Figure 1B:
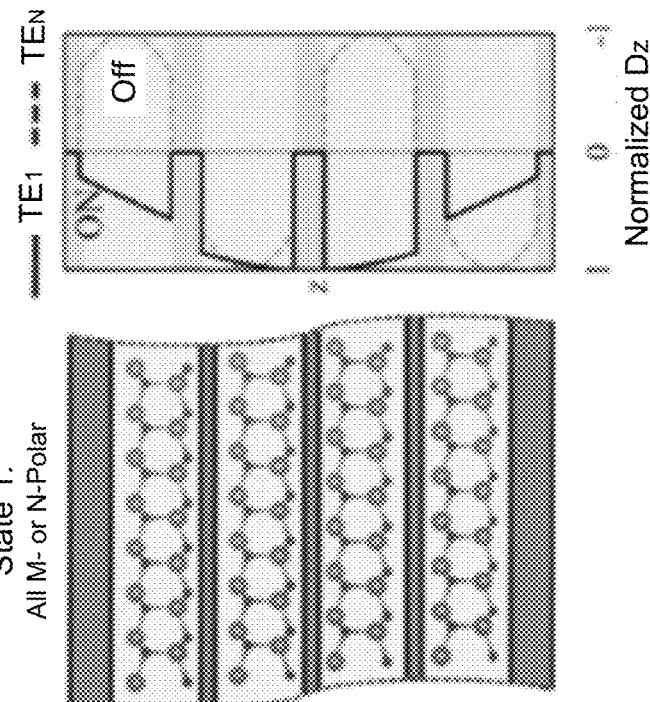

According to various embodiments of the present disclosure, laminated $Sc_xAl_{1-x}N$ BAW resonators with N=2 layers and complementary switchable operation in $TE_i$ or $TE_2$ modes are disclosed. Complementary operation of the disclosed laminated $Sc_xAl_{1-x}N$ BAW resonators is depicted in FIGS. 1B and 1C, showing the electric displacement for $TE_1$ and $TE_N$(N-4) modes in the two operation states according to some embodiments of the present disclosure. FIG. 1B depicts a State 1 where all the $Sc_xAl_{1-x}N$ layers are all either metal—(i.e., M-polar: Sc or Al) nitrogen-polar (i.e., N-polar), resulting in transduction of the $TE_1$ and suppression of $TE_N$ modes. FIG. 1C depicts a State 2 where the $Sc_xAl_{1-x}N$ layers are alternatively M- and N-polar resulting in suppression of $TE_1$ and transduction of $TE_N$ modes.

Exciting the $TE_i$ mode in ferroelectric may require alignment of mechanical mode shape, ferroelectric polarization, and applied electric field. Accordingly, upon switching the polarization of the two $Sc_xAl_{1-x}N$ layers in opposite directions, net polarization (P) across laminate thickness may be reduced to zero, which results in a nulled electromechanical coupling of the $TE_i$ mode, and the resonator is turned off. Such switching may not be achievable in a single-layer BAW resonator, considering the hard ferroelectric behavior of $Sc_xAl_{1-x}N$ limits the practical polarization of each ferroelectric domain to either up or down; thus, depolarization approaches used in soft ferroelectric and piezoelectric materials (e.g., PZT and BST) are not applicable. Depolarization of $Sc_xAl_{1-x}N$ can be achieved through partial switching of domains using low-frequency pulses with slightly lower value compared to coercive. However, this approach is highly uncertain and achieving repeatable depolarized state may not be practical.

Figure 2:
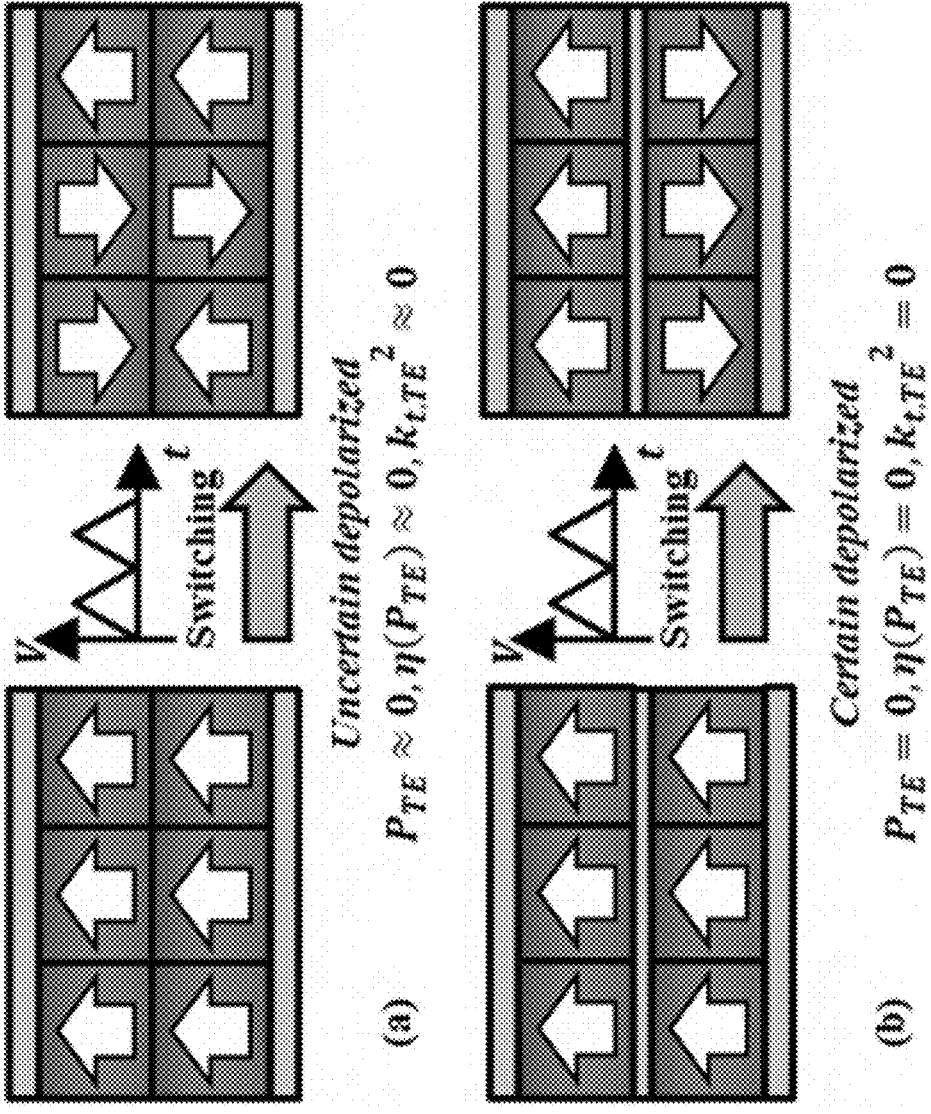
FIG. 2 illustrates a comparison of intrinsic switching in single-layer and laminated $Sc_xAl_{1-x}N$ transducers.

A comparison of intrinsic switching in single-layer and laminated $Sc_xAl_{1-x}N$ transducers are conceptually shown in FIG. 2. According to various embodiments of the present disclosure, the laminated transducer enables deterministic switching based on complete polarization reversal in the bottom $Sc_xAl_{1-x}N$ layer, to oppose the top and null the electromechanical coupling for $TE_1$ mode. In some embodiments, a laminated $Sc_xAl_{1-x}N$ BAW resonator may further include a serpentine-shaped top electrode to enable integrated ovenization of the resonator through application of a DC current and via Joule heating. The integrated ovenization enables temporary heating of the laminated $Sc_xAl_{1-x}N$ BAW resonator during polarization switching, to benefit from large reduction in coercive field of $Sc_xAl_{1-x}N$. This may facilitate reduction of the resonator switching voltage.

Example Resonator Modeling and Design

Figure 3:
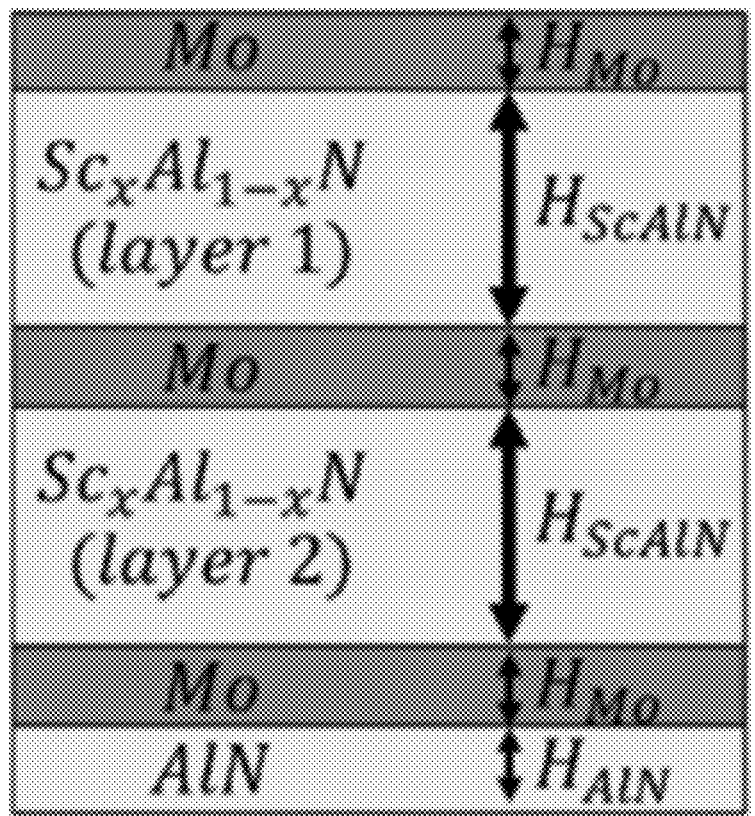
FIG. 3 illustrates a cross-section of an example laminated $Sc_xAl_{1-x}N$ BAW resonator in accordance with some embodiments discussed herein.

In the presence of electrodes with finite thicknesses, operation of the disclosed laminated $Sc_xAl_{1-x}N$ BAW resonator can be modeled using the Mason's waveguide approach. FIG. 3 presents a cross-section of an example laminated $Sc_xAl_{1-x}N$ BAW resonator according to some embodiments of the present disclosure. The depicted laminated $Sc_xAl_{1-x}N$ BAW resonator comprises two $Sc_xAl_{1-x}N$ layers (e.g., 150 nm-thick) and three molybdenum (Mo) electrode layers (e.g., 50 nm-thick), where the $Sc_xAl_{1-x}N$ layers are alternatively stacked between the Mo layers, which are stacked atop of, for example, a 58.5 nm-thick AlN seed layer.

Figure 4:
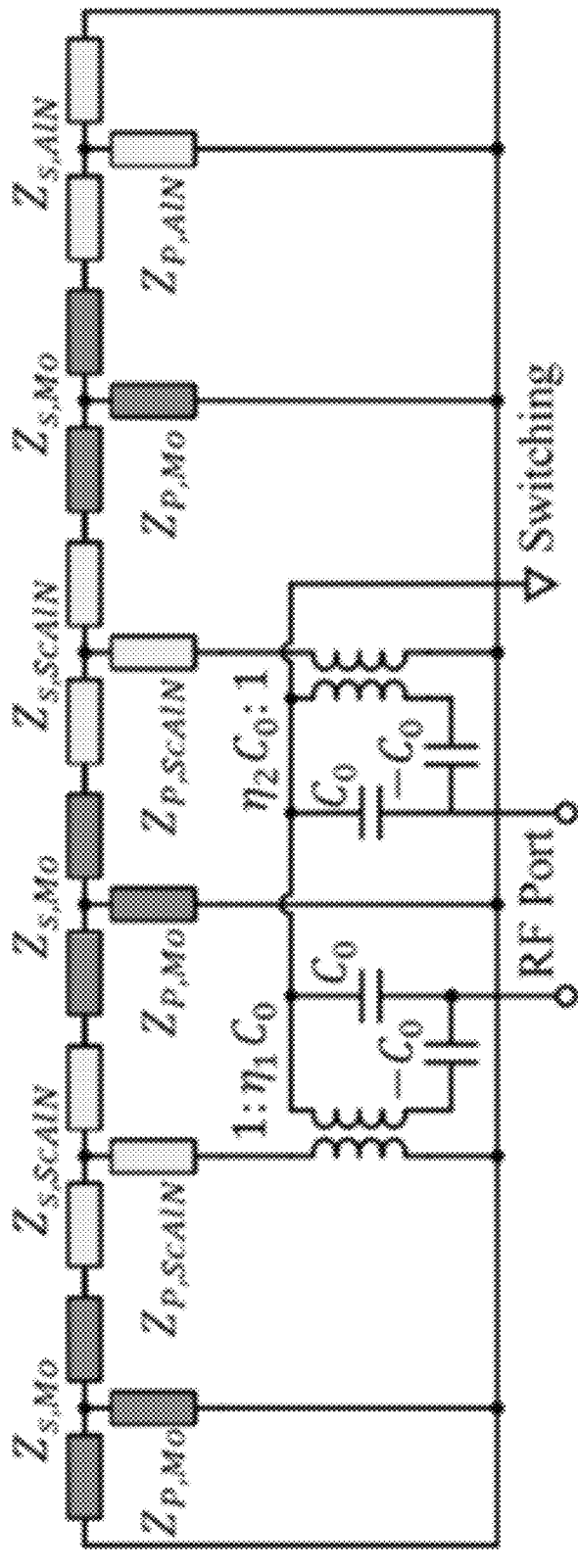
FIG. 4 illustrates a Mason's model corresponding to an example laminated $Sc_xAl_{1-x}N$ BAW resonator in accordance with some embodiments discussed herein.

FIG. 4 presents Mason's model corresponding to the laminated $Sc_xAl_{1-x}N$ BAW resonator of FIG. 3. The Mason's model comprises cascaded waveguides representing the laminate layers. For example, $Z_{s,i}$ and $Z_{ni}$ may comprise the series and shunt acoustic impedance of the layer i (i∈ {Mo, ScAlN, AlN}) in the laminate and formulated as:

$$Z_{s,i} = jZ_i \tan(k_i d_i/2), \tag{12}$$

$$Z_{p,i} = -jZ_i/\sin(k_i d_i).$$

In the above Equation (12), $Z_i$, $k_i$, and $d_i$ may represent the acoustic impedance per unit area, the wavenumber, and the thickness of corresponding layers, respectively, which are defined by z-axis elastic constant $(c_{33,i})$ and mass-density $(\rho_i)$ of each layer and the operation frequency (f), formulated as:

$$Z_i = c_{33,i}k_iA/(2\pi f),\qquad(13)$$

$$k_i = (2\pi f)/\sqrt{c_{33,i}/\rho_i}.$$

The configurable operation of the resonator may be modeled using the polarization-dependent piezoelectric coefficient (i.e., $e_{33,eff,i}=e_{33}P_{inst,i}$) for the transformers representing electromechanical transduction $(\eta_i)$ and in $Sc_xAl_{1-x}N$ layers as:

$$\eta_i = e_{33}P_{inst,i}/\epsilon_{33}.\qquad(14)$$

The static capacitors per unit area corresponding to each $Sc_xAl_{1-x}N$ layers can be derived as:

$$C_{0,i} = \epsilon_{33,i}/d_i.\qquad(15)$$

Figure 5:
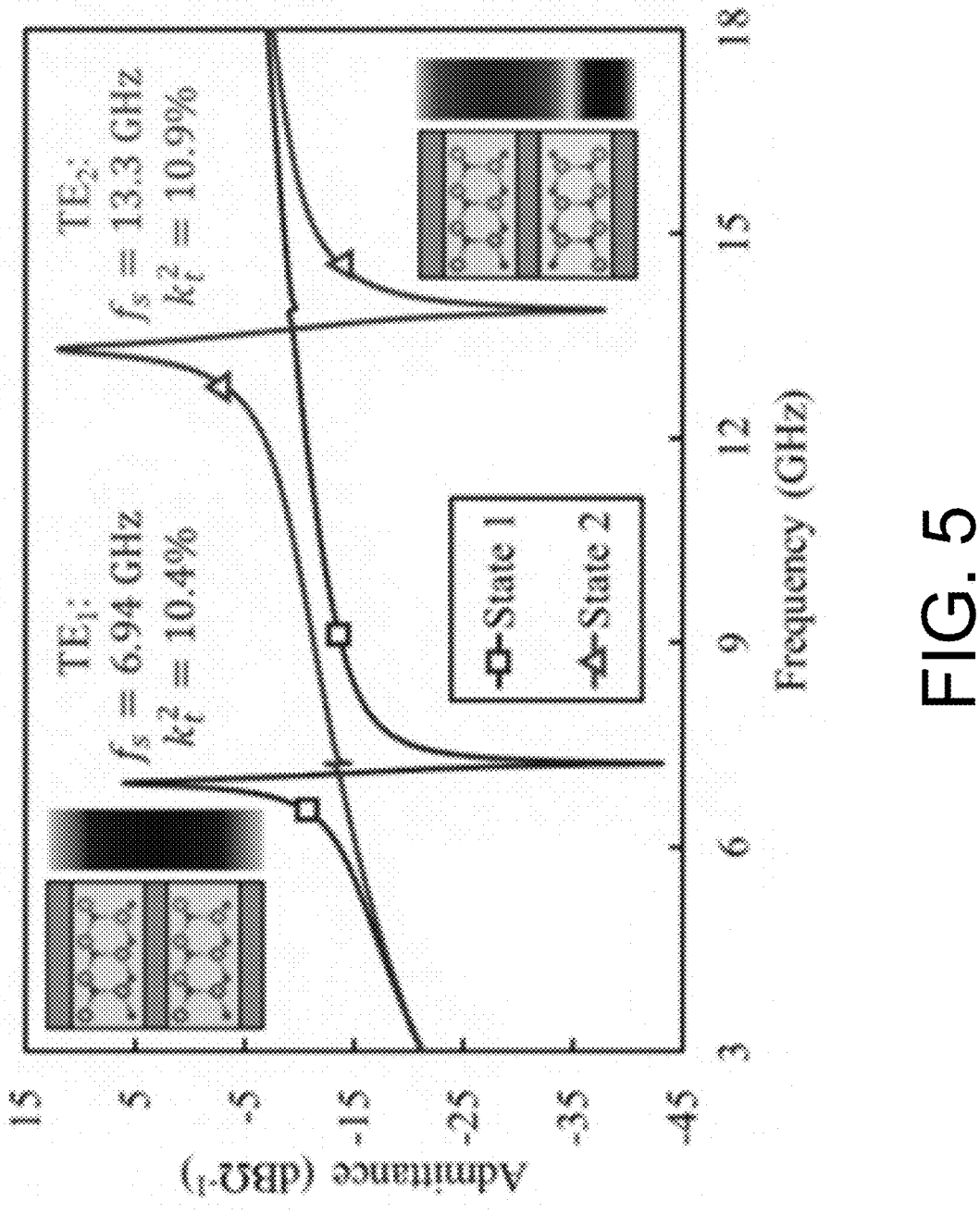
FIG. 5 illustrates simulated admittance of a laminated $Sc_xAl_{1-x}N$ BAW resonator in accordance with some embodiments discussed herein.

FIG. 5 presents simulated admittance of a laminated $Sc_{0.28}Al_{0.72}N$ BAW resonator based on the material properties and layer thicknesses listed in the following Table 1 for the constituent layers, assuming a top-electrode area of 6,500 μm², according to an embodiment of the present disclosure. In State 1 (i.e., $P_{inst,1}=P_{inst,2}$), $TE_1$ can be excited at 6.94 GHz, with a $k_t^2$ of 10.4%, while $TE_2$ is suppressed. Alternatively, in State 2 (i.e., $P_{inst,1}=P_{inst,2}$), $TE_2$ can be excited at 13.3 GHz with a $k_t^2$ of 10.9%, while $TE_1$ is suppressed.

TABLE 1

| Material Properties and Thicknesses of Layers In Laminated $Sc_{0.28}Al_{0.72}N$ BAW Resonator, Used for Modeling | | | |
|---|---|---|---|
| Material | Layer Thickness (nm) | Elastic Modulus (GPa) | Density (Kg/m³) |
| Mo | 50 | 432 | 10,200 |
| $Sc_{0.28}Al_{0.72}N$ | 145 | 275.4 | 3,550 |
| AlN | 58 | 389 | 3,300 |

Figure 6:
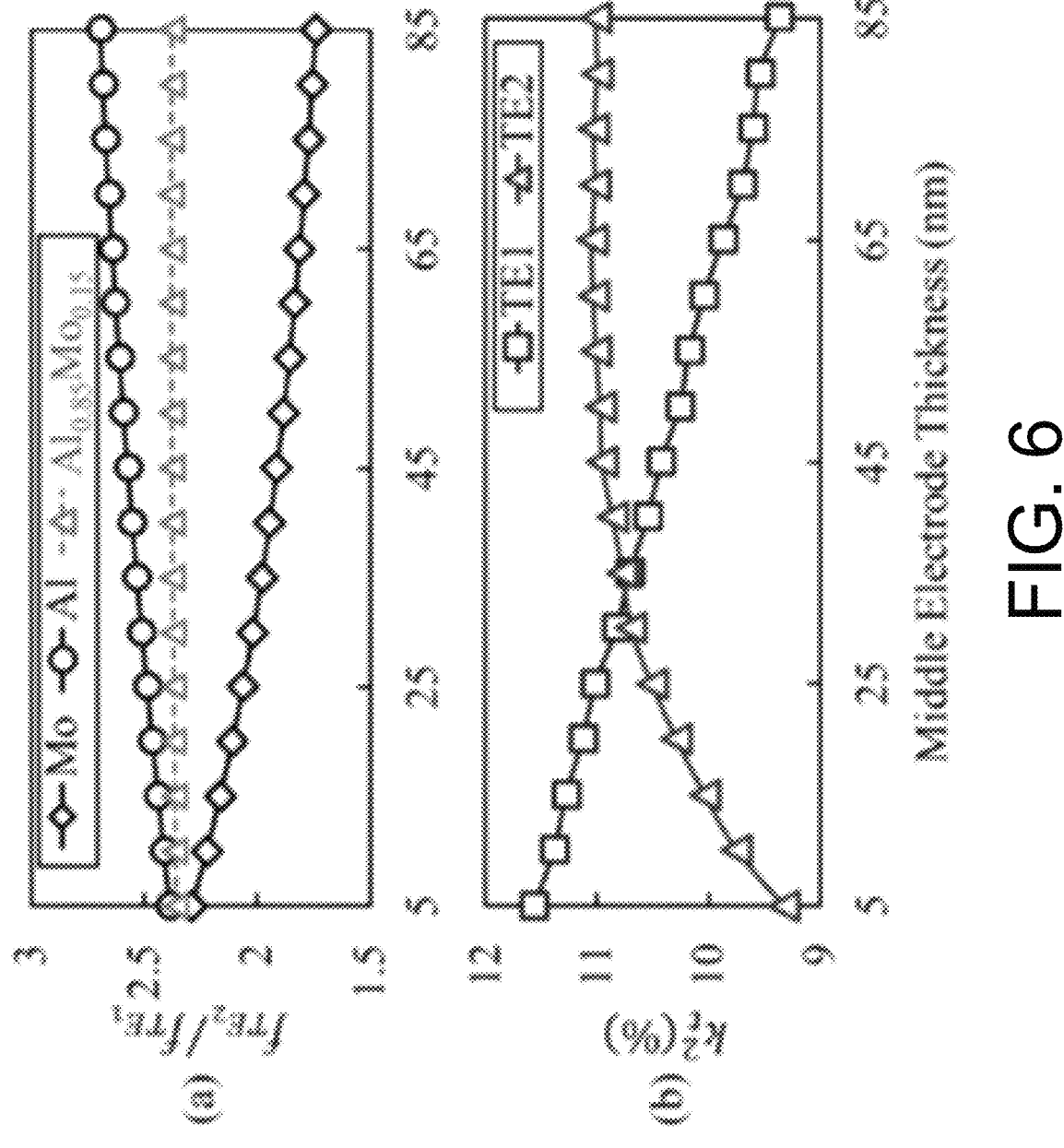
FIG. 6 illustrates frequency ratio and $k_t^2$ of $TE_1$ and $TE_2$ as a function of middle electrode thickness in accordance with some embodiments discussed herein.

According to an example embodiment, the frequency ratio of $TE_1$ and $TE_2$ modes for the laminated $Sc_{0.28}Al_{0.72}N$ BAW resonator is 1.92. This ratio can be controlled by changing the thickness or material of the middle electrode layer. Chart (a) presented in FIG. 6 shows the $TE_1$ and $TE_2$ frequency ratio as a function of the middle electrode layer thickness for aluminum (Al) and Mo. When using Mo, the thickness of the middle electrode layer can be optimized to achieve an integer ratio of 2. Having a resonator with complementary-switchable modes with integer ratio is highly desirable for sub- and super-harmonic communication schemes that are used for enhancement of data rate and reduction of latency in congested wireless networks. Further, using Mo—Al alloy, with 15% Mo atomic fraction, for the middle electrode layer enables sustaining a constant frequency ratio across large thickness variations that may result from process uncertainties. It should be noted that the change in middle electrode layer thickness has an opposite effect the $k_t^2$ of $TE_1$ and $TE_2$ modes, considering the contrasted z-axis strain profile of the two modes at the center of laminate. Chart (b) presented in FIG. 6 shows the $k_t^2$ of $TE_1$ and $TE_2$ mode for different Mo middle electrode layer thicknesses. Opting for proper thickness (i.e., 35 nm) the same $k_t^2$ of 10.8% can be achieved for both modes.

Example Resonator Fabrication

Figure 7:
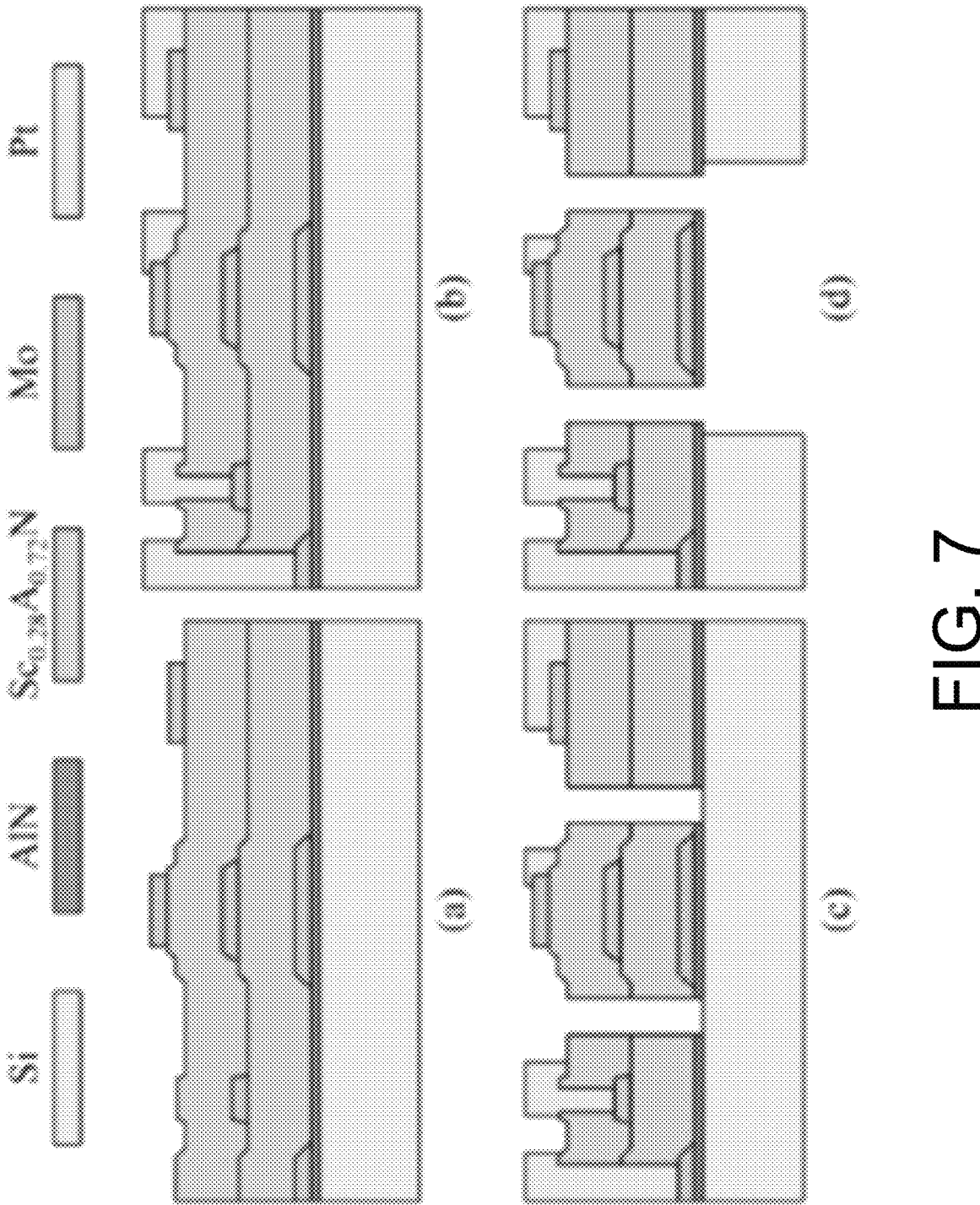
FIG. 7 illustrates a fabrication process diagram for creating a laminated $Sc_{0.28}Al_{0.72}N$ BAW resonator in accordance with some embodiments discussed herein.

According to a first example embodiment, a laminated $Sc_xAl_{1-x}N$ BAW resonator may comprise two approximately 150 nm-thick $Sc_{0.28}Al_{0.72}N$ layers and three approximately 50 nm-thick Mo electrode layers. FIG. 7 depicts a fabrication process diagram for creating the laminated $Sc_{0.28}Al_{0.72}N$ BAW resonator according to the first example embodiment of the present disclosure. The process may comprise successive deposition and patterning of $Sc_{0.28}Al_{0.72}N$ and Mo electrode layers on a silicon (Si) substrate (starting from (a) and progressing to (d)). $Sc_{0.28}Al_{0.72}N$ may be deposited using reactive magnetron sputtering from segmented scandium-aluminum targets. Each of the Mo electrode layers may comprise one or more electrodes deposited using DC sputtering. Prior to deposition of a bottom Mo electrode layer, a (e.g., approximately 58 nm) AlN layer may be deposited to serve as a seed, enabling textured growth of Mo film. This may further help c-axis textured-growth of $Sc_{0.28}Al_{0.72}N$ films.

Figure 8A:
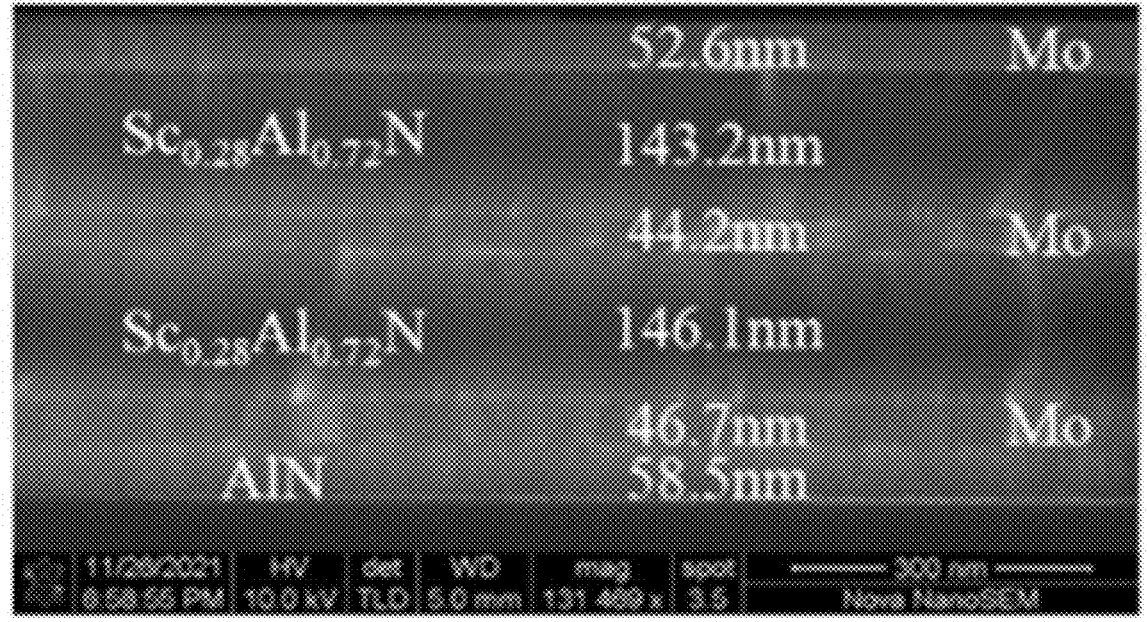
FIGS. 8A and 8B illustrate example cross-sectional scanning electron microscope (SEM) images of a transducer stack in accordance with some embodiments discussed herein.

FIG. 8A depicts an example cross-sectional scanning electron microscope SEM image of a transducer stack, highlighting the thickness of constituent layers in the first example laminated $Sc_{0.28}Al_{0.72}N$ BAW resonator. Prior to deposition of a first $Sc_{0.28}Al_{0.72}N$ layer, a bottom Mo electrode layer may be patterned using boron trichloride (BCl₃) gas in an inductively coupled plasma reactive-ion-etching (RIE ICP) system. A bottom Mo electrode may be patterned using tapered photoresist mask features created by proximity exposure mode photolithography. This may enable formation of Mo patterns with slanted sidewalls for crack-free growth of successive $Sc_{0.28}Al_{0.72}N$ layers. A similar procedure may be repeated to pattern middle Mo electrodes and prior to deposition of the second $Sc_{0.28}Al_{0.72}N$ layer.

Figure 8B:
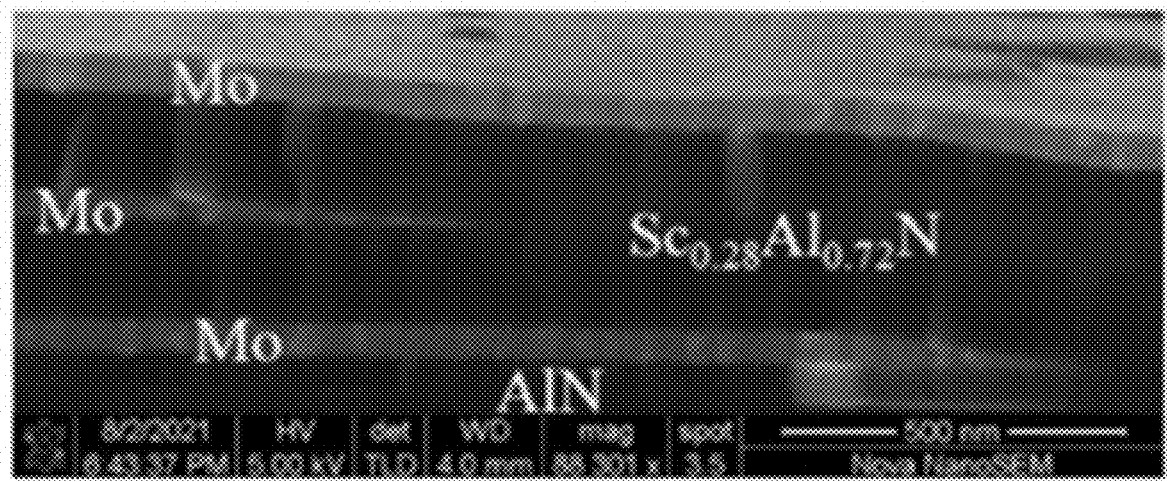
Figure 8C:
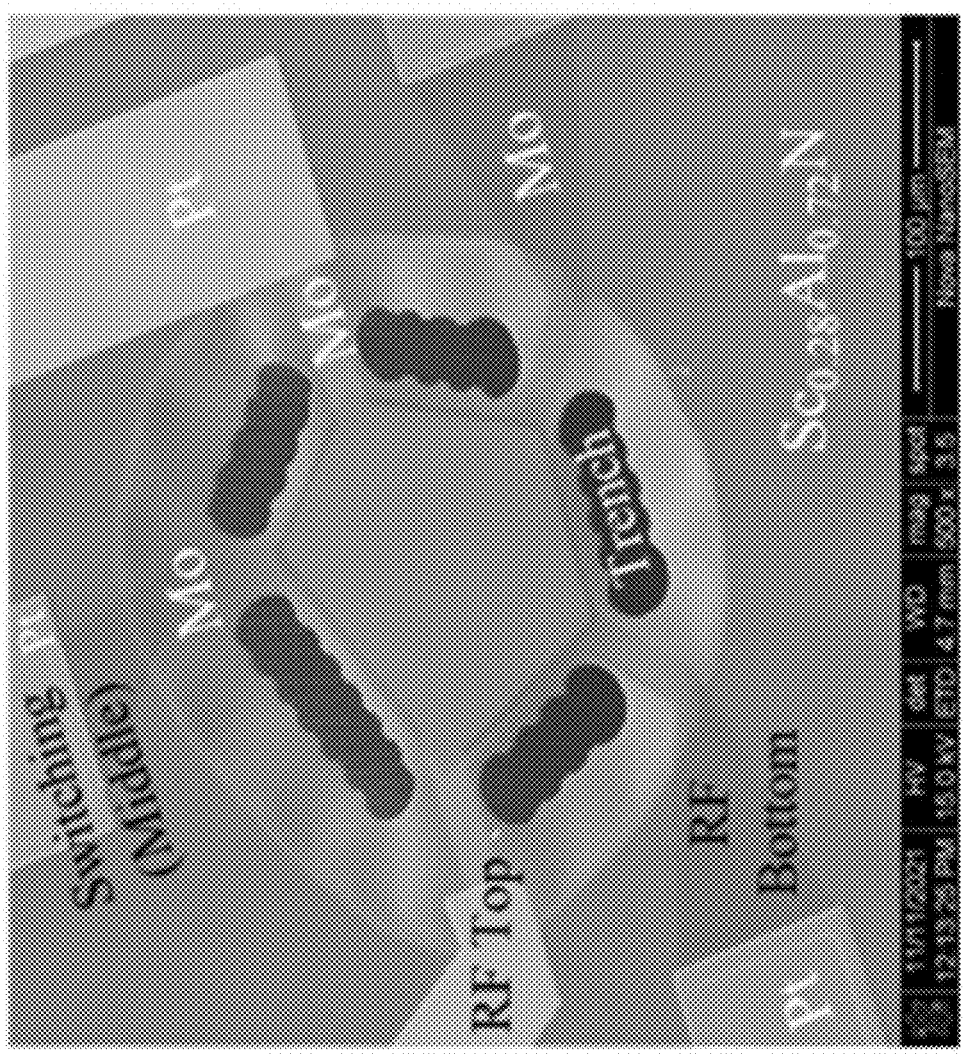
FIG. 8C illustrates a SEM image of a laminated $Sc_{0.28}Al_{0.72}N$ BAW resonator in accordance with some embodiments discussed herein.

FIG. 8B depicts an example cross-sectional SEM of a transducer stack at the edge of patterned bottom and middle Mo electrodes, highlighting the slanted sidewall and crack-free texture of $Sc_{0.28}Al_{0.72}N$ layers according to the first example embodiment. After deposition of a second $Sc_{0.28}Al_{0.72}N$ layer and a third Mo electrode layer, top electrodes may be patterned using a similar etch process as bottom and middle Mo electrode layers, but with a photoresist mask created in contact mode lithography, to achieve straight walls. Following deposition of the transducer stack, the $Sc_{0.28}Al_{0.72}N$ layers may be etched using a timed chlorine-hydrogen (Cl₂—H₂) based recipe to reach bottom and middle Mo electrodes. Next, a (e.g., 500 nm-thick) platinum (Pt) layer may be deposited and patterned using lift-off to create routing lines and pads. The resonator lateral geometry may then be patterned using silicon-dioxide hardmask and BC₃ recipe. The resonators are released by deep-reactive-ion-etching of a Si handle layer from the backside of the substrate. FIG. 8C presents a SEM image of the laminated $Sc_{0.28}Al_{0.72}N$ BAW resonator according to the first example embodiment, where the RF and switching terminals are highlighted.

According to a second example embodiment, a laminated $Sc_xAl_{1-x}N$ BAW resonator may comprise two approximately 140 nm-thick $Sc_{0.28}Al_{0.72}N$ layers, three approximately 50 nm-thick Mo electrode layers, where a top layer one of the MO electrode layers comprises a serpentine heater.

Figure 9:
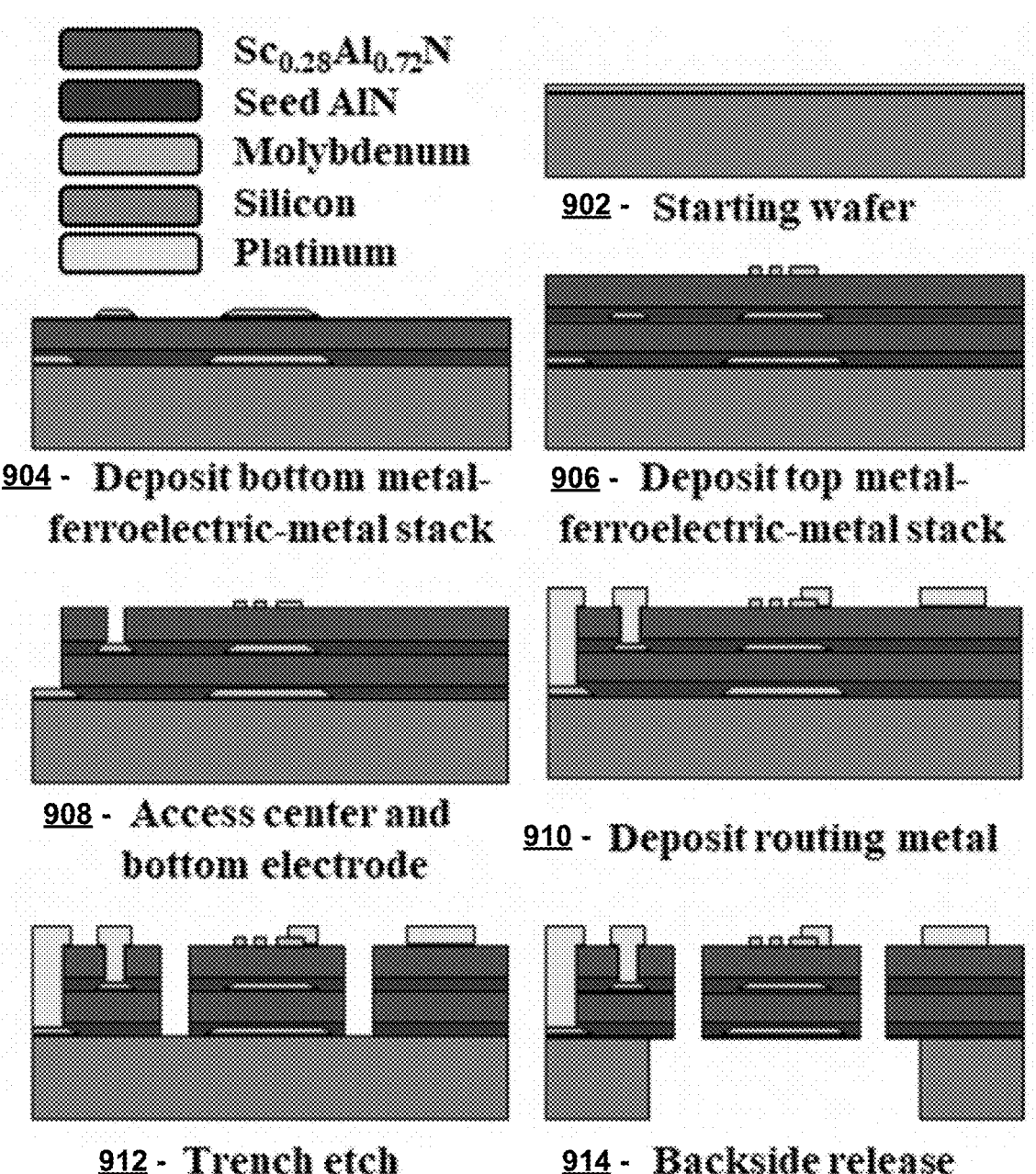
FIG. 9 illustrates a fabrication process diagram for creating a laminated $Sc_{0.28}Al_{0.72}N$ BAW resonator in accordance with some embodiments discussed herein.

FIG. 9 presents a fabrication process diagram for creating the laminated $Sc_{0.28}Al_{0.72}N$ BAW resonator according to the second example embodiment of the present disclosure. The laminated $Sc_{0.28}Al_{0.72}N$ BAW resonator may be created from a starting wafer (step 902) by sputtering a 50 nm bottom Mo electrode layer atop of a AlN seed layer (step 904). The AlN seed layer may help textured growth of Mo and facilitate crystalline growth of subsequent $Sc_{0.28}Al_{0.72}N$ films in c-axis orientation.

Further, the seed layer ensures the suppression of abnormal grains with undesired crystal morphology. After patterning the bottom Mo electrode layer, a 140 nm bottom $Sc_{0.28}Al_{0.72}N$ layer may be sputtered followed by deposition and patterning of a middle Mo electrode layer. At step 906, another layer of $Sc_{0.28}Al_{0.72}N$ may be sputtered followed by deposition and patterning of a top Mo electrode layer into serpentine heaters. The bottom and middle Mo electrodes may be patterned using proximity-exposed photoresist etch-mask and $BCl_3$ dry-etch recipe to form a highly tapered sidewall profile.

Figure 10:
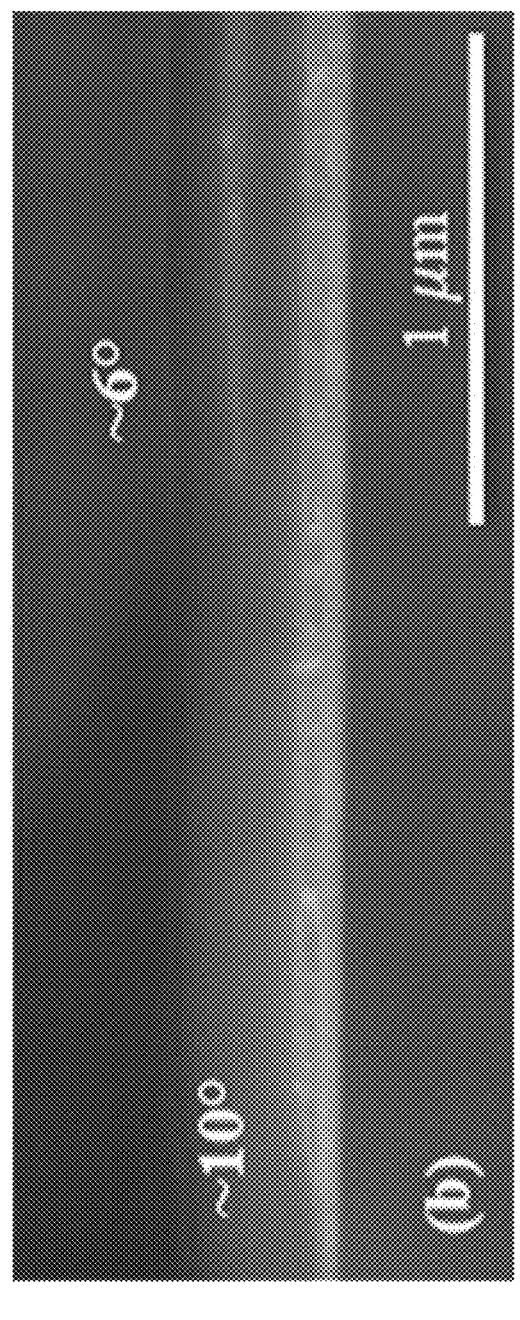
FIG. 10 illustrates an example SEM of a tapered sidewall of bottom and middle Mo electrodes in accordance with some embodiments discussed herein.

FIG. 10 presents an example SEM of a tapered sidewall of bottom and middle Mo electrodes to enables crack-free growth of $Sc_{0.28}Al_{0.72}N$ layers according to the second example embodiment. Referring back to FIG. 9, at step 908, after completion of a transducer stack, bottom and middle electrodes may be accessed by dry etching of $Sc_{0.28}Al_{0.72}N$ layers using a high-power $Cl_2$ recipe. At step 910, a thick platinum (Pt) layer may be deposited using liftoff, to serve for low-loss routings and pad. At step 912, trenches can then be etched to define the geometry of the resonator. At step 914, the device may then be released by etching Si handle-layer from backside. The AlN seed layer may serve as an etch stop to prevent over-etch into the device and its bottom Mo electrode layer.

Figure 11A:
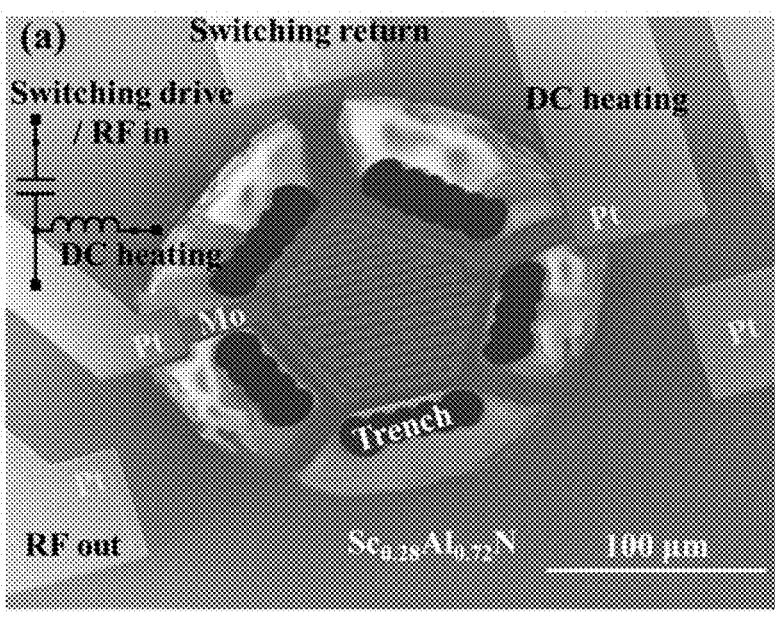
FIG. 11A illustrates a top-view SEM image of a laminated $Sc_{0.28}Al_{0.72}N$ BAW resonator in accordance with some embodiments discussed herein.
Figure 11B:
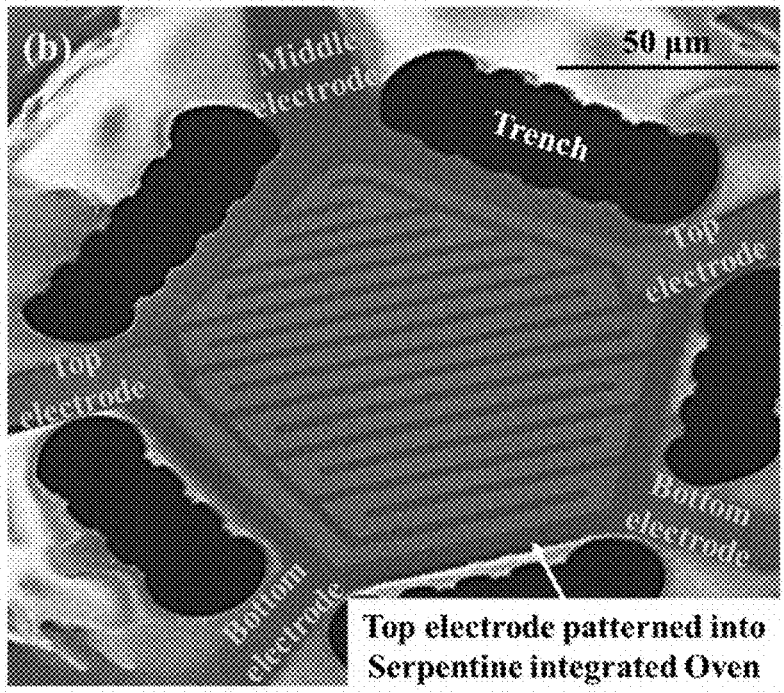
FIG. 11B illustrates a zoomed-in SEM of a top electrode in accordance with some embodiments discussed herein.

FIG. 11A presents a top-view SEM image of the laminated $Sc_{0.28}Al_{0.72}N$ BAW resonator according to the second example embodiment. The laminate resonator shown in FIG. 11A may enable switching of the resonator between on and off states, upon pulsed poling of the two $Sc_{0.28}Al_{0.72}N$ layers in the same or opposite direction, respectively. FIG. 11B presents a zoomed-in SEM of a top electrode patterned to form an integrated oven for Joule heating according to the second example embodiment.

Example Resonator Characterization

Figure 12:
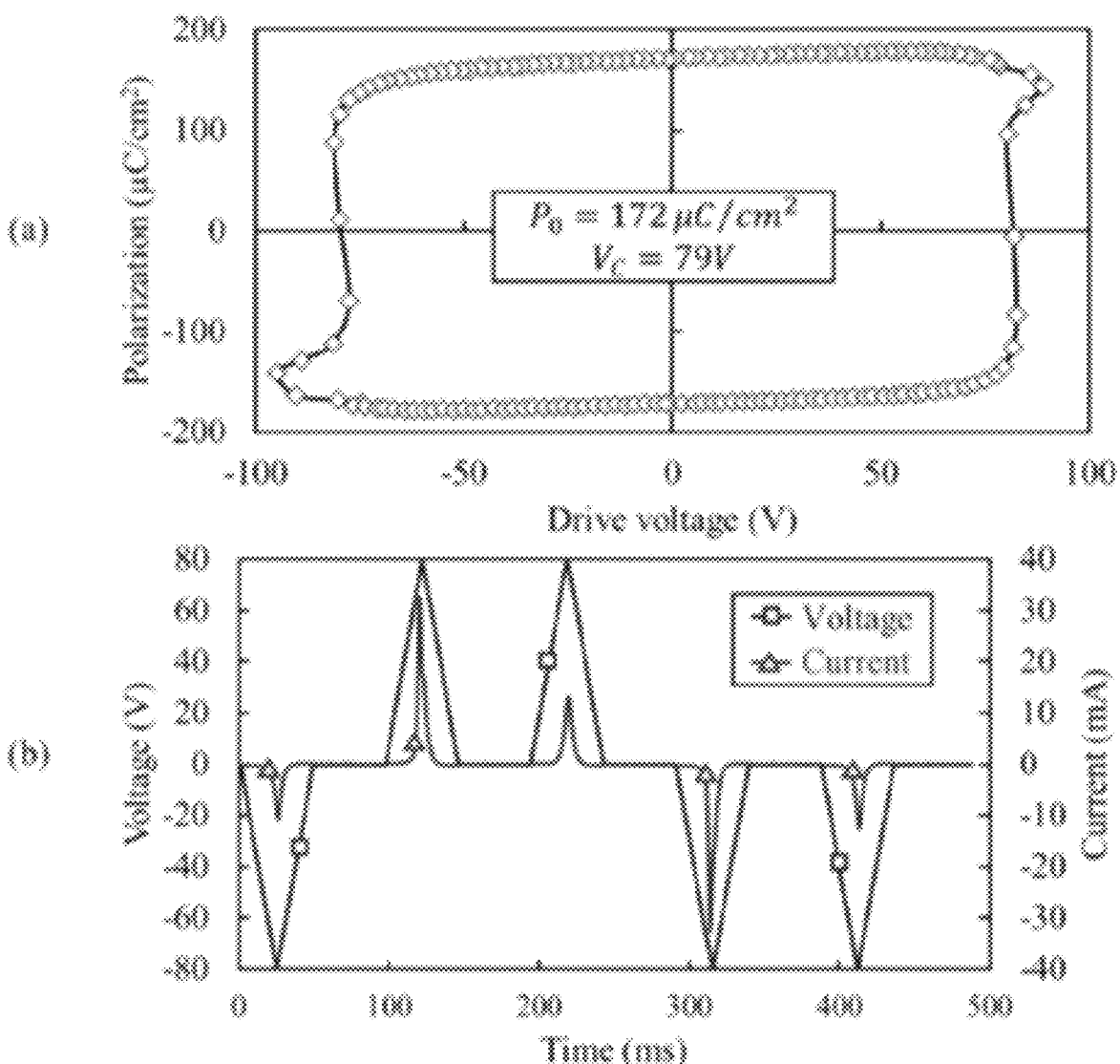
FIG. 12 illustrates resonator characterization of a laminated $Sc_{0.28}Al_{0.72}N$ BAW resonator in accordance with some embodiments discussed herein.

The polarization hysteresis loop of the 150 nm-thick $Sc_{0.28}Al_{0.72}N$ layers according to the first example embodiment may be measured by driving the $Sc_{0.28}Al_{0.72}N$ layers using 20 kHz bipolar triangular signals with 80V amplitude and measuring instantaneous current. Chart (a) of FIG. 12 depicts measured polarization-voltage hysteresis loop for the top $Sc_{0.28}Al_{0.72}N$ layer, used for resonator switching between $TE_1$ and $TE_2$ modes. A coercive voltage of 79V can be measured, highlighting the large voltage required for polarization switching of the $Sc_{0.28}Al_{0.72}N$ layer. Chart (b) of FIG. 12 depicts measured instantaneous current for bipolar triangular pulse-train drive that can be used for polarization switching between M- and N-polar states. The large current at the transition between positive and negative triangular pulses is induced by the polarization switching. While application of 80V enables switching with a single pulse, opting for smaller voltages may result in partial switching and facilitates observation of resonator response evolution as transitioning between the two states.

Resonator admittance may be extracted from a reflection coefficient ($S_{11}$) measured using, e.g., Keysight N5222A PNA vector network analyzer (VNA) with GSG probes calibrated using short-open-load-though procedure with CS-5 calibration substrate, and $k_t^2$ and Q values may be calculated using:

$$k_t^2 = \frac{\pi^2}{8}\left(\frac{f_p^2 - f_s^2}{f_s^2}\right), Q = \frac{f}{2}\left|\frac{\partial \varphi_Y}{\partial f}\right|. \tag{16}$$

Figure 13:
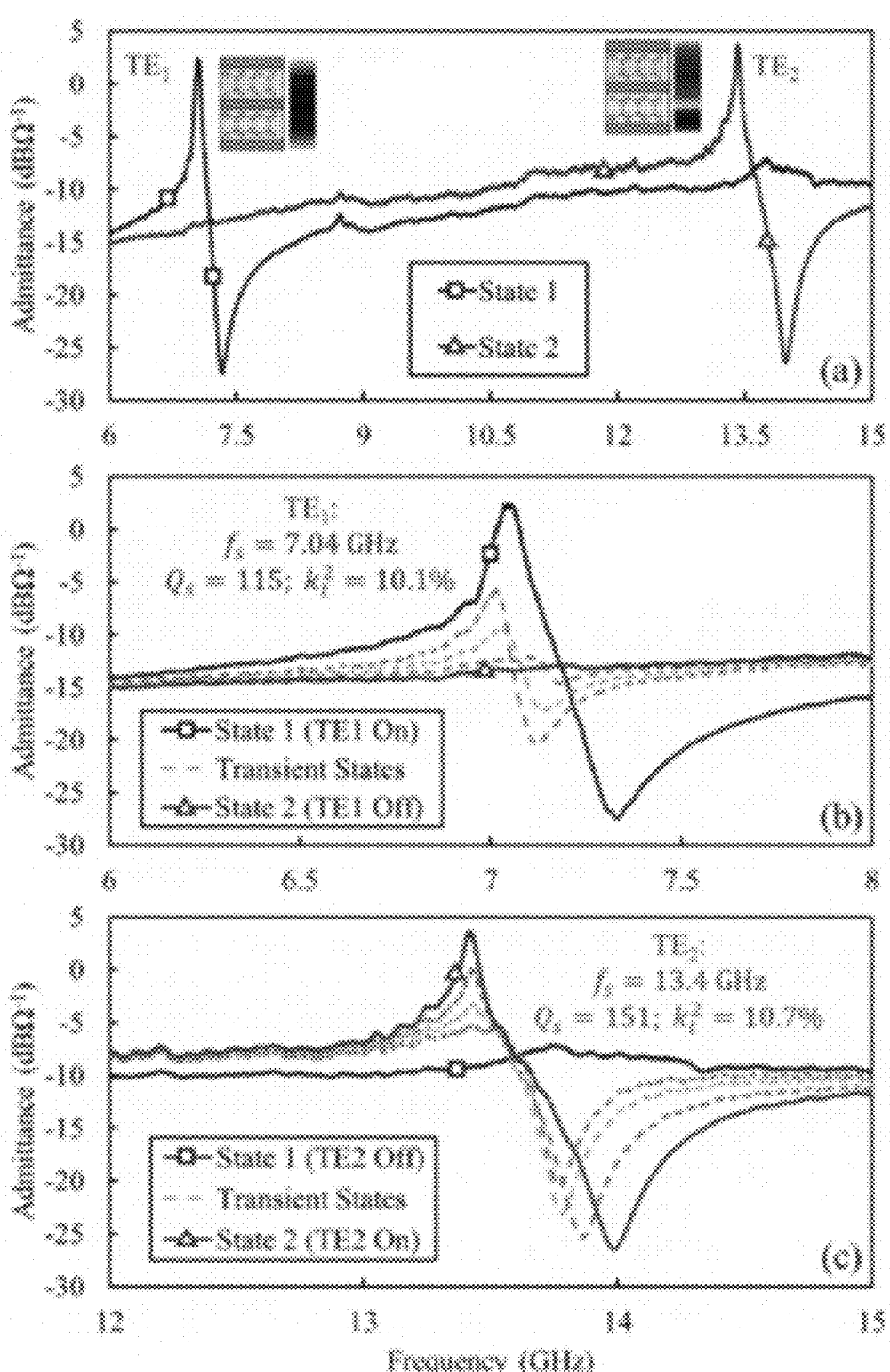
FIG. 13 illustrates large-span admittance and performance metrics of $TE_1$ and $TE_2$ modes in State 1 and State 2 for a laminated $Sc_{0.28}Al_{0.72}N$ BAW resonator in accordance with some embodiments discussed herein.

Chart (a) of FIG. 13 depicts a large-span admittance of the laminated $Sc_{0.28}Al_{0.72}N$ BAW resonator in two operation states according to the first example embodiment. In State 1, both $Sc_{0.28}Al_{0.72}N$ layers are poled in the same direction (M-polar in FIG. 8(a)), resulting in excitation of $TE_1$ and suppression of $TE_2$ modes. Upon application of 20 kHz triangular switching pulses to the bottom $Sc_{0.28}Al_{0.72}N$ layer, the resonator reconfigures to State 2, where the $TE_1$ mode is suppressed and $TE_2$ is emerged. Chart (b) and (c) of FIG. 13 depict performance metrics of $TE_1$ and $TE_2$ modes, in State 1 and State 2, respectively. In particular, the short-span admittance when operating in each state is depicted, highlighting the evolution across inter-state transition. Using ~78V switching voltage, the transition is obtained by application of 5 pulses. $f_s$ and $f_p$ represent the series and parallel resonance frequencies and $\varphi_Y$ represents admittance phase. In State 1, $TE_1$ operates at 7.04 GHz with a Q of 115 and $k_{t2}$ of 10.1%. In State 2, $TE_2$ operates at 13.4 GHz with a Q of 151 and $k_t^2$ of 10.7%.

Figure 14:
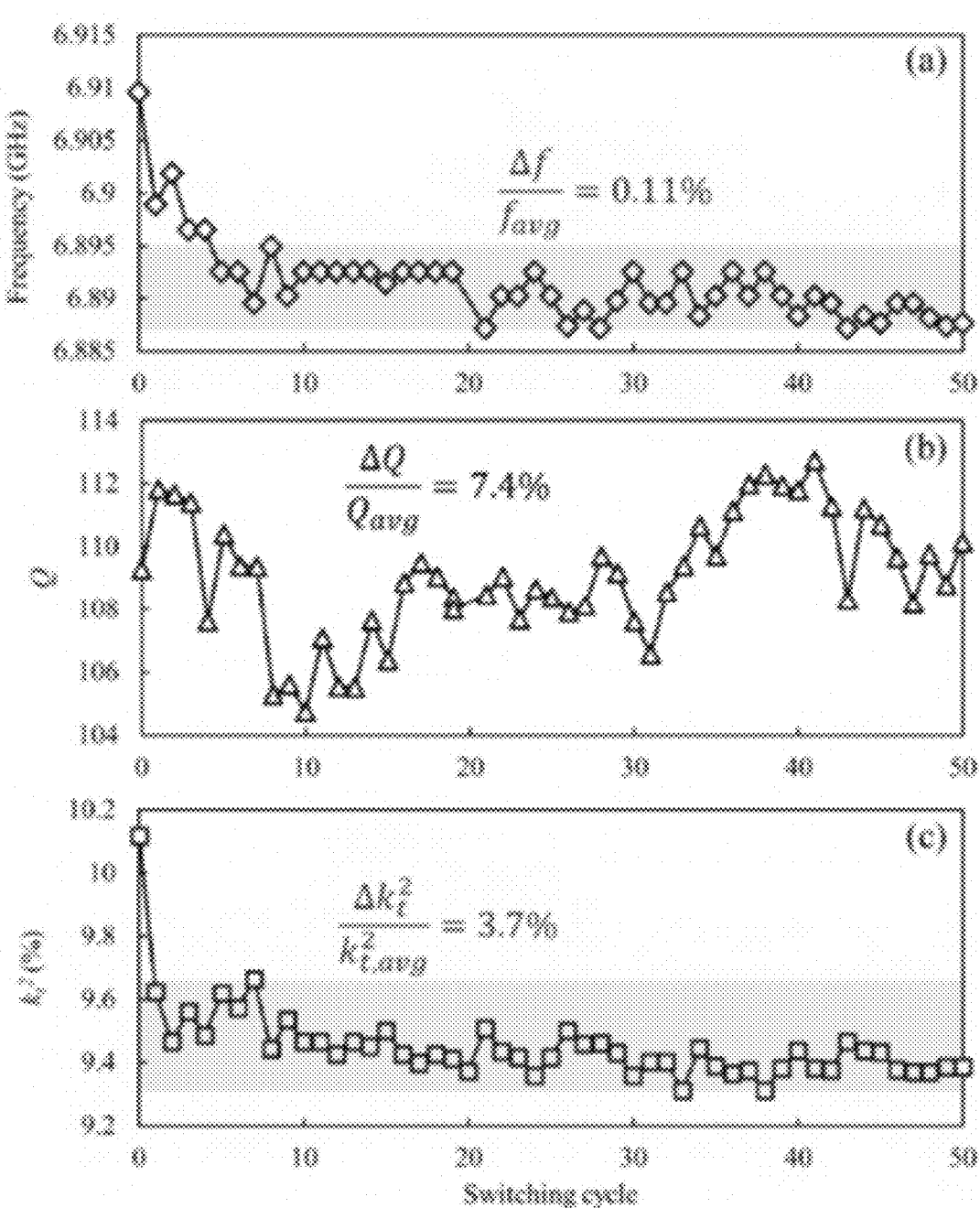
FIG. 14 illustrates variations in frequency, Q and $k_t^2$ of the $TE_1$ mode over switching in accordance with some embodiments discussed herein.

FIG. 14 depicts the variations in frequency, Q and $k_t^2$ of the $TE_1$ mode over switching according to the first example embodiment. The performance retention of the laminated $Sc_{0.28}Al_{0.72}N$ BAW resonator of the first example embodiment is depicted for 50 switching cycles. Early in the switching cycles (i.e., after the first 5 cycles), a slight drop is observed in frequency and $k_t^2$. This may correspond to fractional domain wall pinning and due to defects and imperfect intergranular boundaries, which induce undesirable charge cancellation in the $Sc_{0.28}Al_{0.72}N$ resonator. After these initial degradations, a stable operation is observed with frequency fluctuations within 0.11%, and Q and $k_t^2$ variations within 7.4% and 3.7%, respectively. Similar to other ferroelectric devices, the performance retention in switchable $Sc_{0.28}Al_{0.72}N$ BAW resonators can be significantly improved by enhancing crystallinity of $Sc_{0.28}Al_{0.72}N$ film and reduction of defects.

Figure 15:
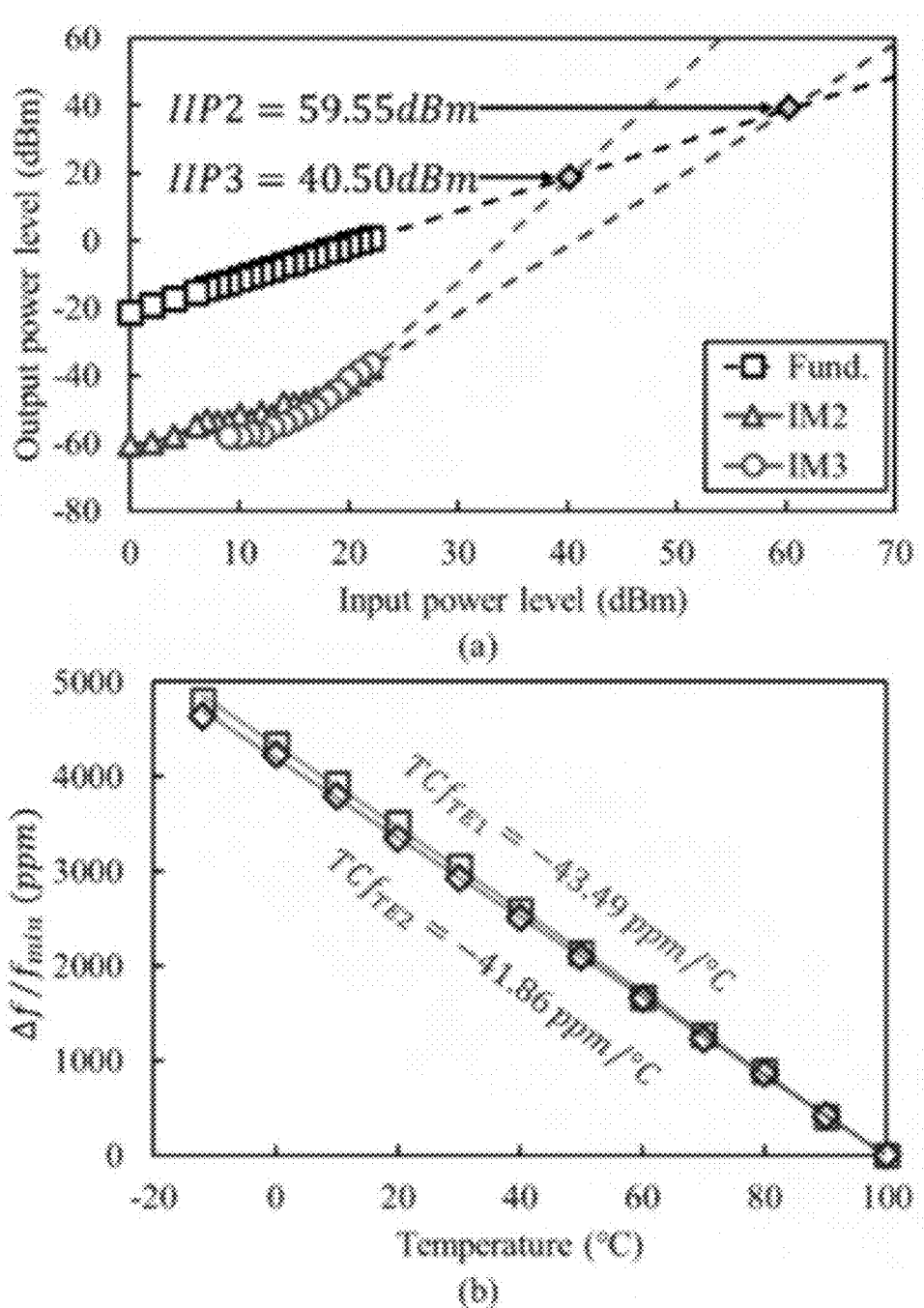
FIG. 15 illustrates nonlinearity and temperature characteristics in accordance with some embodiments discussed herein.

The nonlinearity of the laminated $Sc_{0.28}Al_{0.72}N$ BAW resonator according to a first example embodiment is measured using second- and third-order input intercept point (i.e., IIP2 and IIP3) for the $TE_1$ mode. Chart (a) of FIG. 15 presents the nonlinearity characteristic of the resonator, highlighting IIP2 and IIP3 of 59.5 dBm and 40.5 dBm, respectively. Chart (b) of FIG. 15 presents measured temperature characteristics of $TE_1$ and $TE_2$ modes frequency, over −20° C. to 100° C. Linear temperature coefficient of frequency (TCF) of −43.49 ppm/° C. and −41.86 ppm/° C. are measured for $TE_1$ and $TE_2$ modes, respectively. The slightly higher temperature sensitivity of $TE_1$ mode may correspond to the placement of middle Mo in high-strain region of the mode-shape and the large negative temperature coefficient of elasticity of Mo.

Figure 16:
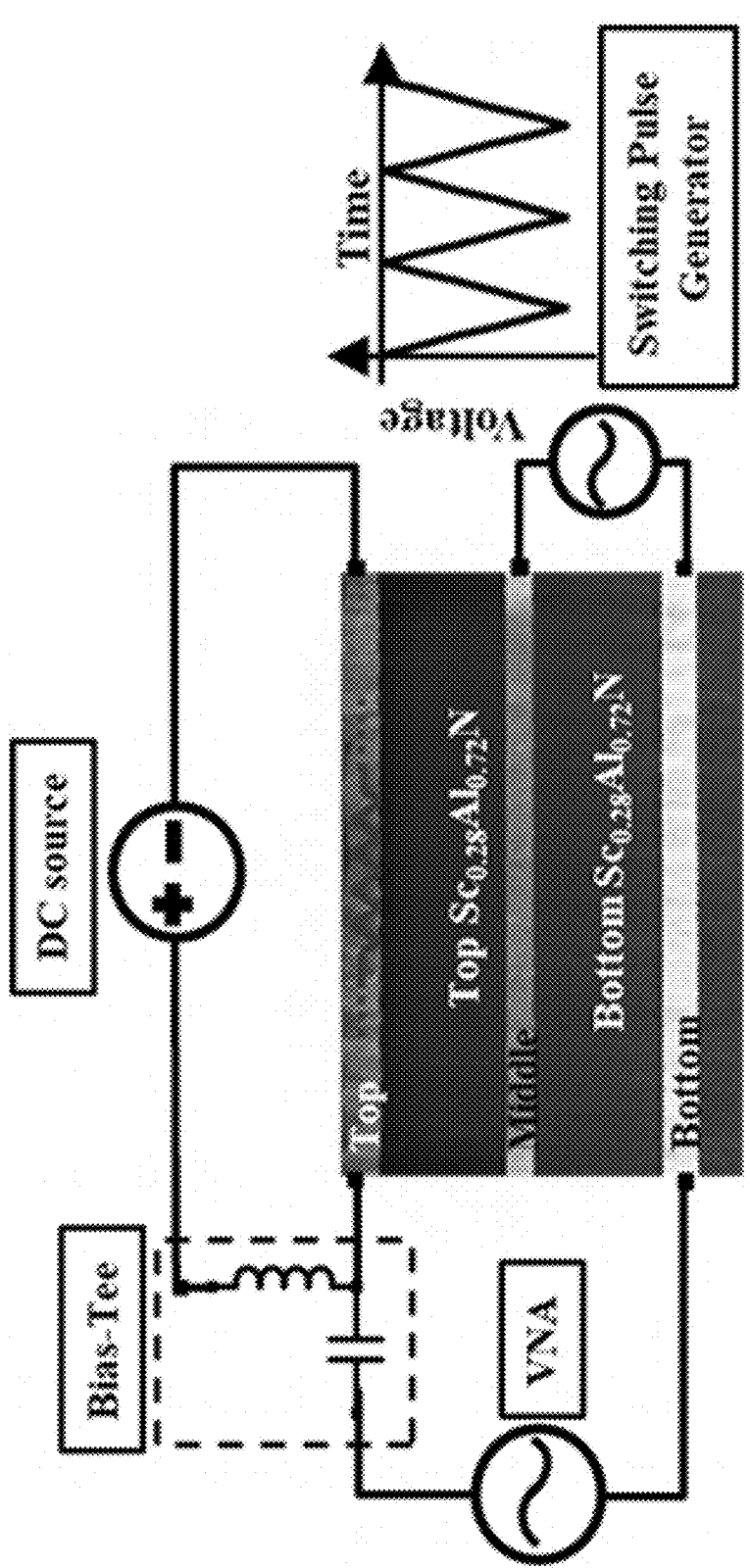
FIG. 16 illustrates an example measurement setup showing an ovenization voltage application through a bias-tee in accordance with some embodiments discussed herein.
Figure 17:
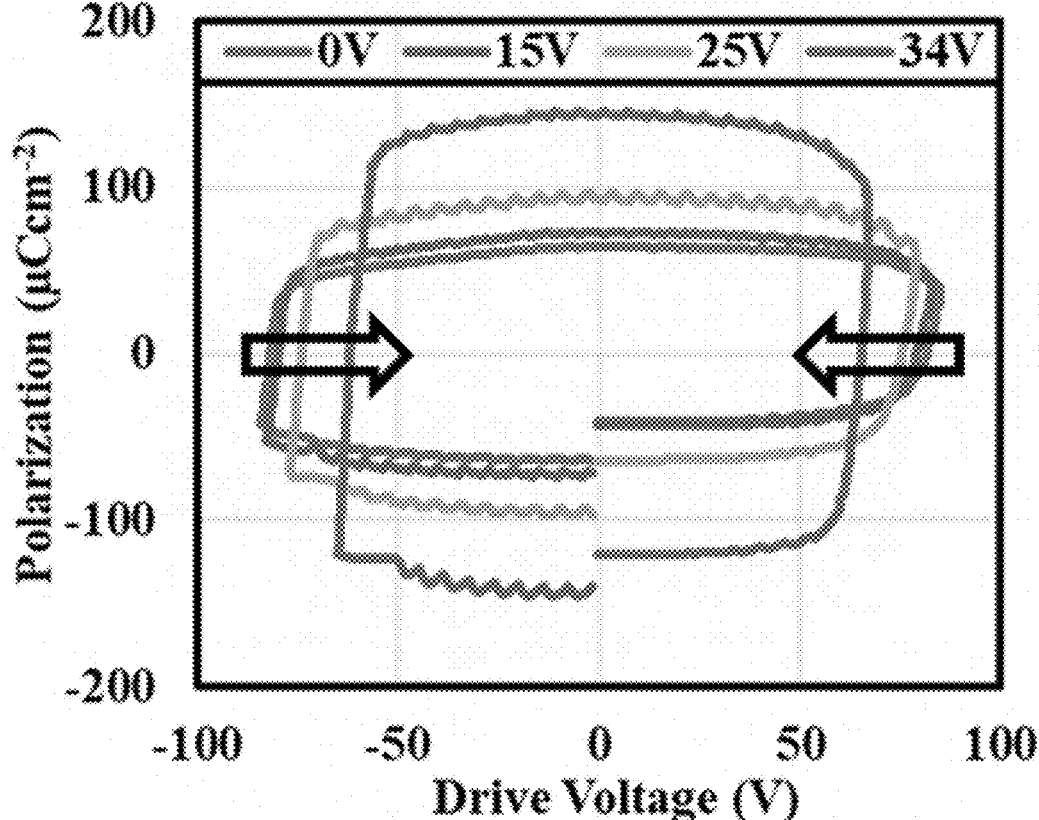
FIG. 17 illustrates measured hysteresis loops for different DC ovenization voltages in accordance with some embodiments discussed herein.

The polarization hysteresis loop of the 140 nm bottom $Sc_{0.28}Al_{0.72}N$ layer according to the second example embodiment may be measured by exciting the bottom $Sc_{0.28}Al_{0.72}N$ layer with 84V, 25 kHz bipolar triangular pulses. The polarization hysteresis loop may be measured under ovenization through application of different DC voltages across the serpentine electrode. FIG. 16 depicts an example measurement setup showing an ovenization voltage application through a bias-tee according to an embodiment of the present disclosure. FIG. 17 depicts measured hysteresis loops for different DC ovenization voltages, highlighting the reduction of coercive field at higher DC voltages, corresponding to increased temperature of the $Sc_{0.28}Al_{0.72}N$ layer associated with the second example embodiment. As such, a reduction in the voltage required for switching is created upon application of the ovenization. It should be noted that the apparent scaling of the loop in y-axis direction upon increased ovenization voltage direction is due to an increased feedthrough current at higher temperatures, rather than any change in remanent polarization of the $Sc_{0.28}Al_{0.72}N$ layer.

Figure 18:
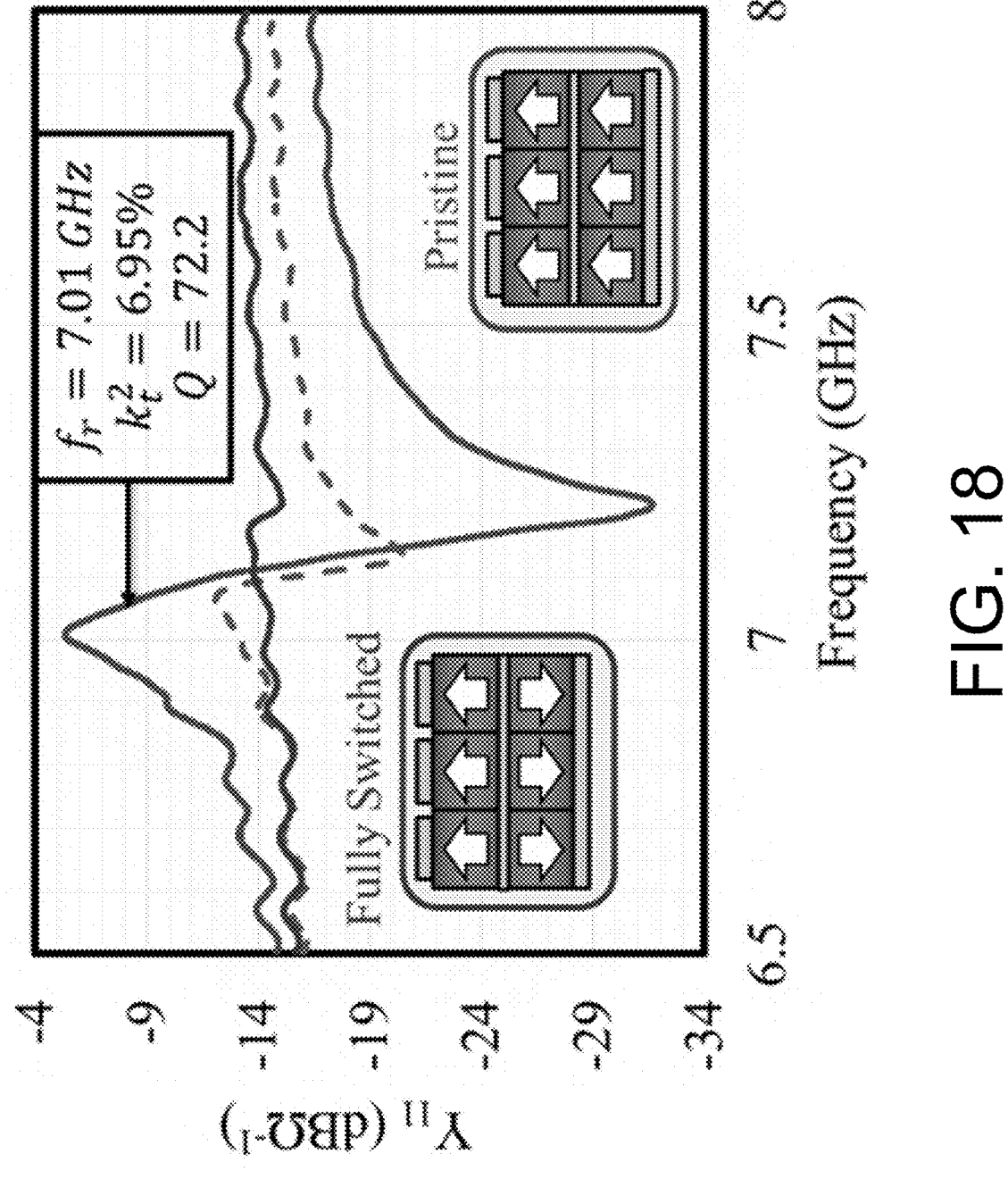
FIG. 18 illustrates measured admittance of a laminated $Sc_{0.28}Al_{0.72}N$ BAW resonator in accordance with some embodiments discussed herein.
Figure 19:
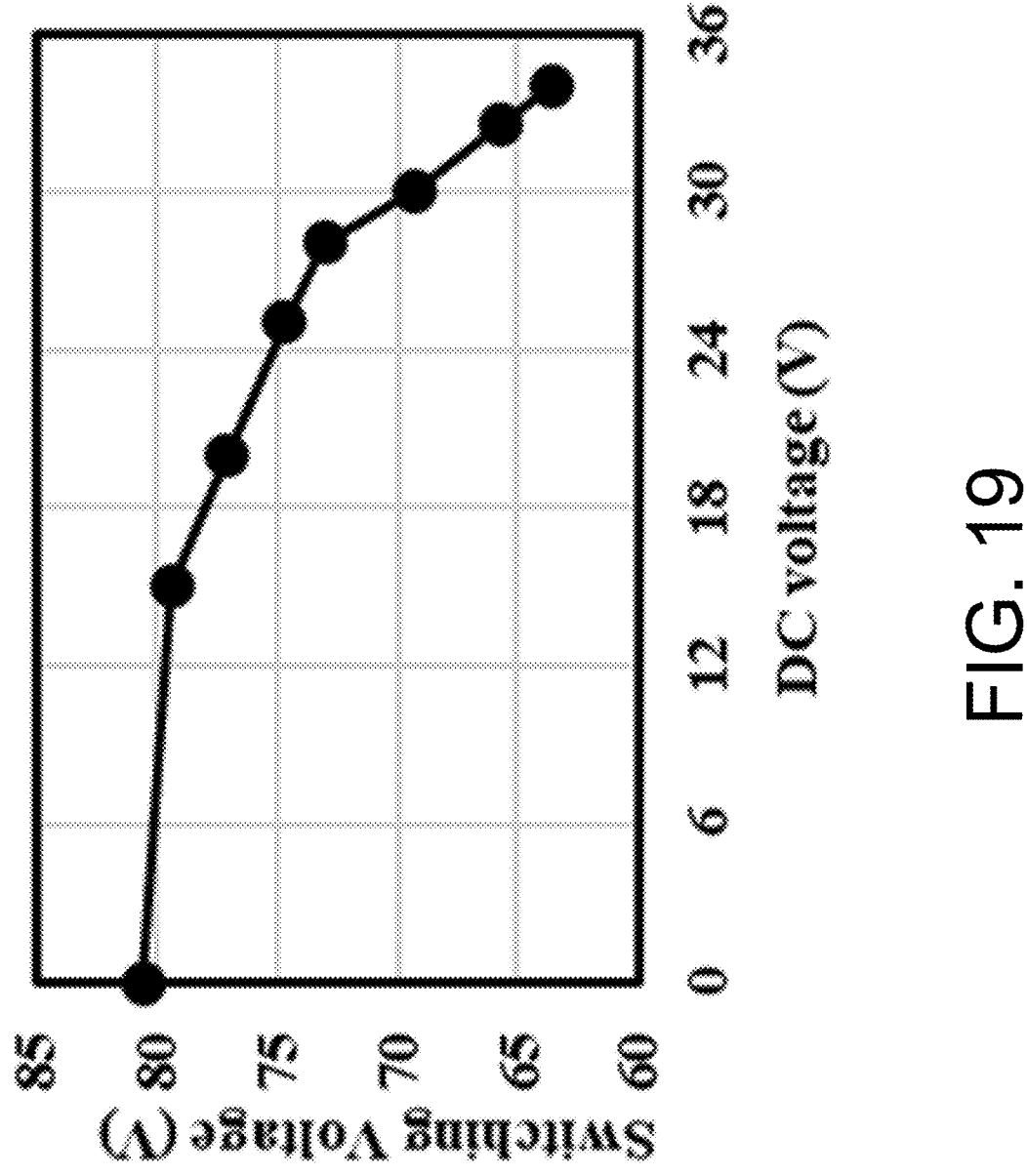
FIG. 19 illustrates a change in switching voltage upon application of DC ovenization voltages in accordance with some embodiments discussed herein.

FIG. 18 depicts measured admittance of the laminated $Sc_{0.28}Al_{0.72}N$ BAW resonator, as evolving from on-state to off-state upon pulsed switching, according to the second example embodiment. A $k_t^2$ of 6.95% and a Q of 72.2 is measured for the resonator operating in $TE_1$ BAW mode at 7.01 GHz. The resonator switching is performed by application of two 25 kHz 80V monopolar triangular pulses across the bottom $Sc_{0.28}Al_{0.72}N$ layer to induce polarization reversal. The intermediate state, i.e., the admittance after the first pulse, is also depicted in FIG. 18. FIG. 19 depicts a change in switching voltage upon application of DC ovenization voltages, highlighting a ~21% reduction (from 80.5V to 63.6V) once applying 34V DC across the serpentine-shaped top electrode.

Example Experimental Implementation of Various Embodiments

A laminated $Sc_{0.28}Al_{0.72}N$ BAW resonator was implemented in a laminated transducer by alternative stacking of two $Sc_{0.28}Al_{0.72}N$ layers with three Mo electrode layers. This structure facilitates independent control on the polarization direction of $Sc_{0.28}Al_{0.72}N$ layers and enables complementary switching of the resonator at 7 GHz and 13.4 GHz in respective first and second thickness-extensional BAW modes ($TE_1$ and $TE_2$). Electromechanical couplings ($k_t^2$) of 10.6% and 10.8%, and series quality factors ($Q_s$) of 109 and 130 were measured when the resonator is operating in $TE_t$(7 GHz) and $TE_2$ (13.4 GHz) modes, respectively. The laminated $Sc_{0.28}Al_{0.72}N$ BAW resonator was used to create a dual-band complementary-switchable ladder filter at 6.93 GHz and 13.2 GHz with fractional bandwidths ($FBW_{-3dB}$) of 5.73% and 6.17%, respectively, and on/off isolation exceeding 9 dB.

Figure 20:
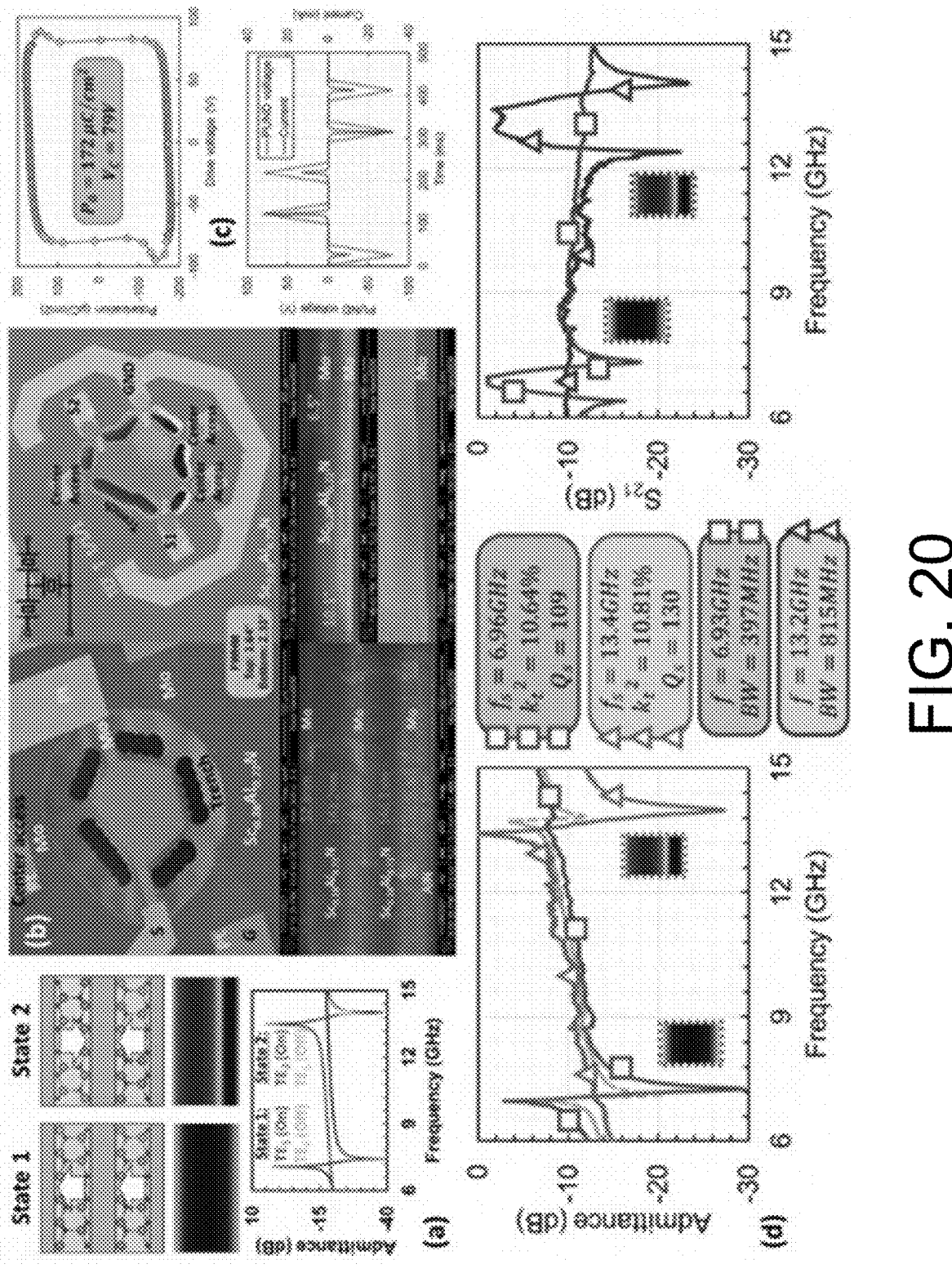
FIG. 20 illustrates an example implementation of a laminated $Sc_{0.28}Al_{0.72}N$ BAW resonator in accordance with some embodiments discussed herein.

In FIG. 20, inset (a) depicts the operation concept, where an active resonance mode is defined based on the polarization direction of $Sc_{0.28}Al_{0.72}N$ layers in the stack. Inset (b) of FIG. 20 depicts a top-view SEM image of the resonator and filter, as well as the cross-sectional SEM image of the laminated transducer. Inset (c) of FIG. 20 depicts the polarization hysteresis loop for the top $Sc_{0.28}Al_{0.72}N$ layer, as well as the triangular pulse train used for polarization tuning and resonator/filter switching. Inset (d) of FIG. 20 depicts the admittance and transmission response of the resonator and filter, in two complementary switchable states.

CONCLUSION

It should be understood that the examples and embodiments described herein are for illustrative purposes only and that various modifications or changes in light thereof will be suggested to persons skilled in the art and are to be included within the spirit and purview of this application.

Many modifications and other embodiments of the present disclosure set forth herein will come to mind to one skilled in the art to which the present disclosures pertain having the benefit of the teachings presented in the foregoing descriptions and the associated drawings. Therefore, it is to be understood that the present disclosure is not to be limited to the specific embodiments disclosed and that modifications and other embodiments are intended to be included within the scope of the appended claim concepts. Although specific terms are employed herein, they are used in a generic and descriptive sense only and not for purposes of limitation.

What is claimed is:

1. A bulk acoustic wave resonator comprising:
   a silicon substrate;
   an aluminum nitride (AlN) layer deposited on the silicon substrate; and
   a stack comprising a plurality of ferroelectric scandium-aluminum nitride (ScAlN) layers that are alternatively stacked between a plurality of molybdenum (Mo) electrode layers, wherein the plurality of ScAlN layers comprise independent switchability of polarization.

2. The bulk acoustic wave resonator of claim 1 further comprising a radio frequency (RF) port and one or more direct current ports, wherein the one or more direct current ports are configured for independent polarization control of the plurality of ScAlN layers.

3. The bulk acoustic wave resonator of claim 1 further comprising intrinsic switchability between a first thickness mode and a second thickness mode based on poling of the plurality of ScAlN layers in same or opposite directions.

4. The bulk acoustic wave resonator of claim 1 further comprising a self-ovenization component configured to reduce switching voltage.

5. The bulk acoustic wave resonator of claim 4, wherein the self-ovenization component comprises a direct current-biased serpentine-shaped top electrode.

6. The bulk acoustic wave resonator of claim 1 further comprising operation in on and off states based on polarization alignment of the plurality of ScAlN layers in same or opposite directions.

7. The bulk acoustic wave resonator of claim 1, wherein the plurality of ScAlN layers are deposited using reactive magnetron sputtering from segmented scandium-aluminum targets.

8. The bulk acoustic wave resonator of claim 1, wherein the plurality of Mo electrode layers are deposited using direct current sputtering.

9. The bulk acoustic wave resonator of claim 1, wherein a bottom one of the plurality of Mo electrode layers is patterned using boron trichloride (BCl3) gas in an inductively coupled plasma reactive-ion-etching system.

10. The bulk acoustic wave resonator of claim 1, wherein a bottom Mo electrode layer of the plurality of Mo electrode layers comprises a bottom Mo electrode patterned using tapered photoresist mask features created by proximity exposure mode photolithography.

11. The bulk acoustic wave resonator of claim 1, wherein one or more of the plurality of Mo electrode layers include slanted sidewalls.

12. The bulk acoustic wave resonator of claim 1, wherein a top one of the plurality of Mo electrode layers comprises a top Mo electrode patterned using a photoresist mask created in contact mode lithography.

13. The bulk acoustic wave resonator of claim 1, wherein the plurality of ScAlN layers are etched using a timed chlorine-hydrogen ($Cl_2$—$H_2$) based recipe.

14. The bulk acoustic wave resonator of claim 1, wherein the plurality of ScAlN layers are configured to switch operation via application of a corresponding plurality of pulse signals.

15. The bulk acoustic wave resonator of claim 1 further comprising a first state including a first thickness-extensional mode that operates at approximately 7 GHz and a second state including a second thickness-extensional mode that operates at approximately 13 GHz.

16. The bulk acoustic wave resonator of claim 1 further comprising complementary switchable operation between a first operation state and a second operation state.

17. The bulk acoustic wave resonator of claim 16, wherein the first operation state comprises unanimous polarization direction in the plurality of ScAlN layers.

18. The bulk acoustic wave resonator of claim 16, wherein the second operation state comprises alternative polarization switching of the plurality of ScAlN layers.

19. The bulk acoustic wave resonator of claim 16, wherein a frequency ration of the first operation state and the second operation state is based on a thickness of the AlN layer or the plurality of Mo electrode layers.

\* \* \* \* \*